US012278598B2

(12) United States Patent
Prathapan et al.

(10) Patent No.: US 12,278,598 B2
(45) Date of Patent: Apr. 15, 2025

(54) PARALLELIZED LOW NOISE AMPLIFIERS FOR A QUANTUM COMPUTER

(71) Applicant: International Business Machines Corporation, Armonk, NY (US)

(72) Inventors: Mridula Prathapan, Zurich (CH); Thomas Morf, Gross (CH); Peter Mueller, Zurich (CH); Marcel A. Kossel, Reichenburg (CH); Bogdan Cezar Zota, Rueschlikon (CH); Pier Andrea Francese, Adliswil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 602 days.

(21) Appl. No.: 17/651,829

(22) Filed: Feb. 21, 2022

(65) Prior Publication Data
US 2023/0268890 A1 Aug. 24, 2023

(51) Int. Cl.
*H03F 1/26* (2006.01)
*G06N 10/20* (2022.01)
*H03F 1/02* (2006.01)
*H03F 1/56* (2006.01)

(52) U.S. Cl.
CPC ............... *H03F 1/26* (2013.01); *G06N 10/20* (2022.01); *H03F 1/0211* (2013.01); *H03F 1/56* (2013.01); *H03F 2200/294* (2013.01)

(58) Field of Classification Search
CPC . H03F 1/26; H03F 1/0211; H03F 1/56; H03F 2200/294; G06N 10/20; G06N 10/40; G06N 10/80
See application file for complete search history.

(56) References Cited

U.S. PATENT DOCUMENTS

| 8,175,566 B2 | 5/2012 | Tasic et al. |
| 9,870,536 B1 | 1/2018 | Abdo |
| 2012/0081184 A1* | 4/2012 | Pesetski ............. H03F 3/04 330/310 |

(Continued)

FOREIGN PATENT DOCUMENTS

| CN | 114021727 A | 2/2022 |
| TW | 202121267 A | 6/2021 |

(Continued)

OTHER PUBLICATIONS

Peng et al. "A Cryogenic Broadband Sub-1-dB NF CMOS Low Noise Amplifier for Quantum Applications", Jul. 2021, IEEE, Journal of Solid-State Circuits, vol. 56 (Year: 2021).*

(Continued)

*Primary Examiner* — Andrea Lindgren Baltzell
*Assistant Examiner* — Nareh Shamiryan
(74) *Attorney, Agent, or Firm* — Samuel A Waldbaum

(57) ABSTRACT

Provided is a low noise amplifier circuit for a quantum computer. The low noise amplifier circuit comprises a plurality of input stages, a shared output stage, and a voltage controller. Each input stage is coupled to one or more qubits. The shared output stage is coupled to the plurality of input stages. The voltage controller is coupled to the plurality of input stages and the shared output stage. The voltage controller is configured to selectively activate an input stage of the plurality of input stages in order to read a qubit coupled to the input stage.

21 Claims, 20 Drawing Sheets

(56) References Cited

U.S. PATENT DOCUMENTS

| | | | |
|---|---|---|---|
| 2017/0040956 A1 | 2/2017 | Bhat et al. | |
| 2021/0142215 A1 | 5/2021 | Rigetti et al. | |
| 2022/0029589 A1* | 1/2022 | Bardin | H10N 69/00 |
| 2024/0086750 A1* | 3/2024 | Yuan | G06N 10/20 |

FOREIGN PATENT DOCUMENTS

| | | |
|---|---|---|
| TW | 202133056 A | 9/2021 |
| WO | 2021061776 A1 | 4/2021 |

OTHER PUBLICATIONS

Gonzalez-Zalba et al., "Scaling silicon-based quantum computing using CMOS technology: State-of-the-art, Challenges and Perspectives," arXiv.2011.11753v1 [quant-ph] Nov. 23, 2020, 16 pgs.

Hornibrook et al., "Frequency multiplexing for readout of spin qubits," Applied Physics Letter vol. 104, No. 10, Mar. 10, 2014, 4 pgs.

Notification of Transmittal of the International Search Report and the Written Opinion of the International Searching Authority, or the Declaration, International Application No. PCT/EP2023/053879, Apr. 24, 2023, 13 pgs.

Ruffino et al., "Interfacing Qubits via Cryo-CMOS Front Ends," 2018 IEEE International Conference on Integrated Circuits, Technologies and Applications, Nov. 21, 2018, pp. 42-44.

Van Dijk et al., "The electronic interface for quantum processors," Microprocessors and Microsytems, vol. 66, Mar. 15, 2019, pp. 90-101.

Incandela, R.M., "Cryogenic Cmos Lna for RF readout of spin qubits," https://repository.tudelft.nl/islandora/object/uuid%3A982372c7-c6c8-4da3-9fd7-aaeaae270cf8, Oct. 28, 2016, 75 pgs.

Schaal, S. "Scalable and high-sensitivity readout of silicon quantum devices," https://discovery.ucl.ac.uk/id/eprint/10090993/3/Schaal_10090993_thesis.pdf, Jan. 30, 2020, 259 pgs.

Van Rantwijk et al., "Multiplexed Readout for 1000-Pixel Arrays of Microwave Kinetic Inductance Detectors," https://ieeexplore.ieee.org/document/7445881, © 2016 IEEE, 8 pgs.

* cited by examiner

PARALLELIZED LOW NOISE AMPLIFIERS FOR A QUANTUM COMPUTER

BACKGROUND

The present disclosure relates generally to the field of quantum computing, and more particularly to qubit readout circuitry having rapidly switching low noise amplifier (LNA) arrays.

Quantum computing is a type of computation that harnesses the collective properties of quantum states, such as superposition, interference, and entanglement, to perform calculations. The devices that perform quantum computations are known as quantum computers. Unlike conventional computer systems, portions of quantum computers have to be kept at extremely low temperatures, often below 1 K, in order to properly operate.

SUMMARY

Embodiments of the present disclosure include a low noise amplifier circuit for a quantum computer. The low noise amplifier circuit comprises a plurality of input stages, a shared output stage, and a voltage controller. Each input stage is coupled to one or more qubits. The shared output stage is coupled to the plurality of input stages. The voltage controller is coupled to the plurality of input stages and the shared output stage. The voltage controller is configured to selectively activate an input stage of the plurality of input stages in order to read a qubit coupled to the input stage.

Because the low noise amplifier circuit comprises a plurality of input stages that all share an output stage, the total area used by the low noise amplifier circuit can be considerably smaller than conventional amplifier circuits. Furthermore, the reduction in the area usage per readable qubit scales with the number of input stages such that the more qubits the quantum computer has, the greater the overall power savings.

In some optional embodiments, all input stages that are not being read from are inactive (i.e., not being powered). By selectively activating only the input stage that is being read (i.e., that is coupled to the qubit being read), the low noise amplifier circuit uses up significantly less power than conventional amplifier circuits. Furthermore, the reduction in the power usage per readable qubit scales with the number of input stages such that the more qubits the quantum computer has, the greater the overall power savings.

In some optional embodiments, the voltage controller is in the cryostat of the quantum computer. By including the voltage controller in the cryostat, the distance between the voltage controller and the input stages can be reduced. This enables higher data access frequency and lower latency of the quantum computer. It can also reduce the number of cables between the cryostat and the room temperature components, thereby reducing the amount of heat being transferred into the cryostat from outside.

Additional embodiments of the present disclosure include an amplifier array for a quantum computer. The amplifier array comprises a plurality of input stage circuits and a shared output circuit coupled to the plurality of input stage circuits. Each input stage circuit corresponds to one or more qubits. Because the amplifier array comprises a plurality of input stages that all share an output stage, the total area used by the low noise amplifier circuit can be considerably smaller than conventional amplifier circuits. Furthermore, the reduction in the area usage per readable qubit scales with the number of input stages such that the more qubits the quantum computer has, the greater the overall power savings.

Further embodiments of the present disclosure include a quantum computer. The quantum computer comprises a cryostat having a low noise amplifier. The low noise amplifier comprises a plurality of input stages and a shared output stage coupled to the plurality of input stages. Each input stage is coupled to one or more qubits. The quantum computer further comprises a voltage controller coupled to the low noise amplifier. The voltage controller is configured to selectively activate a first input stage of the plurality input stages without activating the other input stages in order to read a qubit coupled to the first input stage.

Because the low noise amplifier comprises a plurality of input stages that all share an output stage, the total area used by the low noise amplifier can be considerably smaller than conventional amplifier circuits. This reduces the amount of hardware that needs to be cooled and also enables a larger number of qubits in a same volume. Additionally, by selectively activating only the input stage that is being read (i.e., that is coupled to the qubit being read), the low noise amplifier uses up significantly less power than conventional amplifier circuits. Furthermore, the reduction in the area usage and power per readable qubit scales with the number of input stages such that the more qubits the quantum computer has, the greater the overall area and power savings.

Additional embodiments of the present disclosure are directed to a method, system, and computer program product for reading a qubit. The method comprises identifying a qubit to be read. The method further comprises selecting, from an amplifier array, a first input stage that is connected to the qubit. The first input stage is selected without powering other inputs stages of the amplifier array. The amplifier array comprises a plurality of input stages and a shared output stage coupled to the plurality of input stages. Each input stage corresponds to one or more qubits.

Advantageously, the method can enable a quantum computer to use the switching of the LNAs to implement a Mux implicitly through rapid on/off operation using a logic controller, without the need for an actual hardware Mux.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
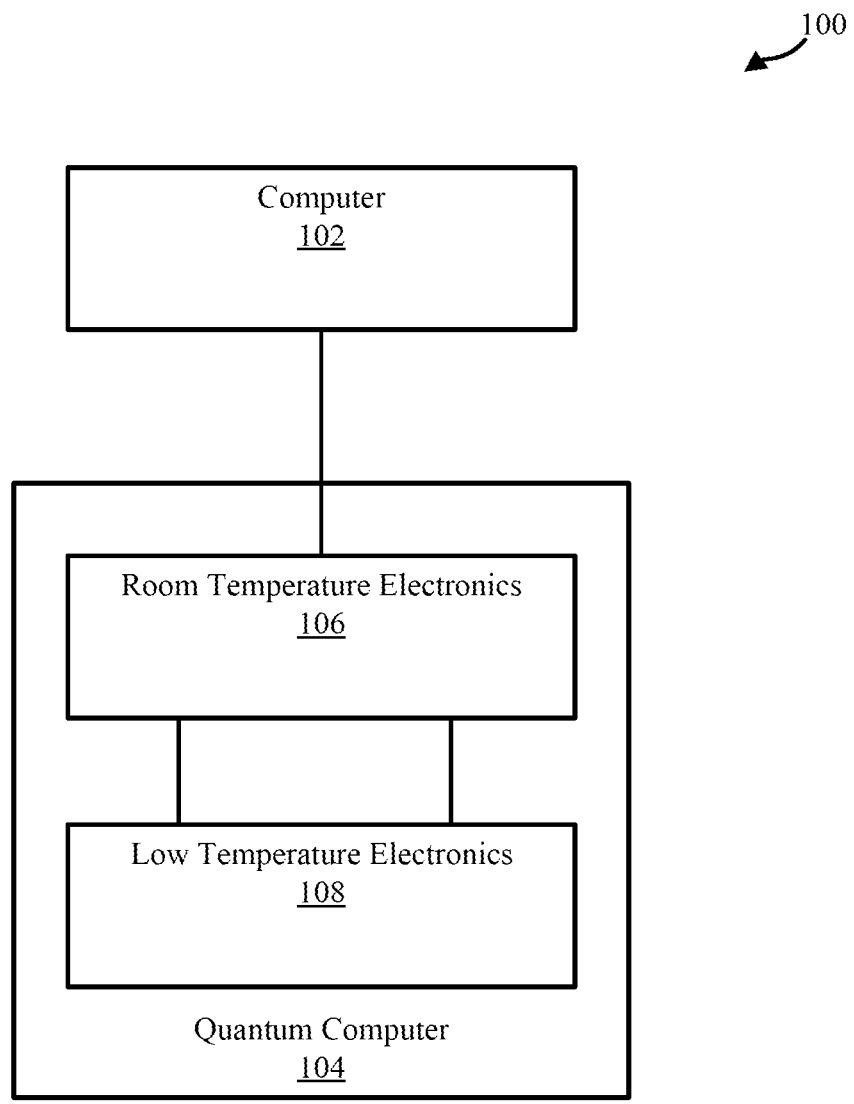
FIG. 1 illustrates a block diagram of an example high-level system architecture in which embodiments of the present disclosure may be implemented.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of quantum computing, and more particularly to qubit readout circuitry having rapidly switching low noise amplifier (LNA) arrays. While the present disclosure is not necessarily limited to such applications, various aspects of the disclosure may be appreciated through a discussion of various examples using this context.

Quantum computing is a type of computation that harnesses the collective properties of quantum states to perform calculations. The devices that perform quantum computations are known as quantum computers. Unlike conventional computer systems, portions of quantum computers have to be kept at extremely low temperatures, often below 1 K, in order to properly operate. This creates numerous challenges, especially with regards to scalability. As the number of qubits that a quantum computer has increases, so too does the amount of hardware that has to be cooled, the amount of power that has to be removed, and the amount of noise that has to be corrected for. For example, the more qubits a quantum computer has, the more cables it will also have that connect the cold portions of the quantum computer (the cryostat) to room temperature portions of the quantum computer, which introduces more heat into the cryostat.

One way that is being explored to address scalability issues is by moving additional electronics of the quantum computer from the room temperature area into the cryostat. This has the advantage of reducing the number of connections between the cryostat and the room temperature. However, there are numerous issues that have to be overcome in order to do this. One such issue related to the amount of cryostat area that is required. As more of the electronics are moved into the cryostat, the volume of the cryostat increases, which presents problems such as increased cost. Additionally, electronic components generate heat. As such, moving additional electronics into the cryostat increases the amount of heat that is dissipated into the cryostat and needs to be removed in order to keep the cryostat at a suitable temperature.

One such component that has been moved into the cryostat are the low temperature amplifiers (LTAs), also referred to herein as low noise amplifiers (LNAs). The LNAs, which are often in the ~4 K region of the cryostat, amplify the small signals generated from reading the qubits and transmit them to a data acquisition unit in the room temperature region. In order to reduce the number of cables between the room temperature region and the cryostat, each LNA may be frequency multiplexed such that it is responsible for amplifying multiple qubits (e.g., 10 qubits for each line).

While this has been acceptable for quantum computers with a small number of qubits, as the computers grow in size, the current LNA design shows its flaws. The standard approach for reducing the area and power usage of the LNAs is to use frequency multiplexing to increase the number of qubits that each LNA is able to read out. However, there are limits to the multiplexing ratio that can be achieved, and as such, the number of LNAs that are required is still too high. For example, a quantum computer with 1100 qubits requires 110 LNAs in the readout path, assuming 1:10 frequency multiplexing. Using current LNA technology, this requires approximately 600 $cm^2$ of area in the cryostat and several Watts of power to cool.

A second approach that has been explored is to incorporate a hardware Mux into the cryostat region. This would allow a single LNA to handle a much larger number of qubits when the hardware Mux is combined with frequency multiplexing. For example, a 3-input hardware Mux placed between the LNA and the qubits could enable 30 qubits to be handled by a single LNA, again assuming 1:10 frequency multiplexing. However, hardware Mux circuits that are suitable for quantum computers are difficult to design and lead to performance losses.

Embodiments of the present disclosure may help address these and other issues related to quantum computer scalability. In particular, embodiments include a scalable readout system that comprises a logic controller and a parallelized low noise amplifier LNA array. The logic controller is a voltage controller that selectively activates individual LNAs of the LNA array in order to read out the associated qubits. The parallelized LNA array includes two distinct regions: an input region having a plurality of input stages and a shared output region. The input region typically has, for each HEMT, an input matching network, which can be powered on-demand (usually together with the corresponding HEMT). The matching network is filtering the input signal (usually a band pass), and it converts the input impedance (often around 50 Ohms) to the required impedance of the HEMT. Each of the input stages corresponds to one or more qubits. For example, each input stage can be frequency multiplexed to handle 10 qubits. The shared, or common, output stage connects to each of the input stages and is used to amplify and output the signal to, for example, circuitry located in the room temperature portion of the quantum computer. The output matching network, located in the output stage, converts the output impedance of the driving HEMTs to the input impedance of the output HEMT.

Each LNA in the LNA array comprises one or more transistors and passive components (e.g., resistors, capacitors, inductors). The transistor may be any suitable transistor type including bipolar junction transistors (BJTs) and field-effect transistors (FETs). In some embodiments, the transistors may be, for example, high-electron-mobility transistors (HEMTs). Each controllable qubit, or group of qubits sharing one line via frequency division multiple access (FDMA), is connected to an input on the LNA array.

During operation, the input stages are selectively activated by the controller in order to select the line of qubits to be read. In other words, the logic controller, which may be located inside the cryostat at the 4 K region or, in some embodiments, in the room temperature portion of the quantum computer, rapidly switches on and off the LNAs to read out the target qubit(s). Accordingly, the readout system is able to use the switching of the LNAs to implement a Mux implicitly through rapid on/off operation using a logic controller, without the need for an actual hardware Mux.

Numerous benefits are realized by this approach. First, when compared to the standard approach (a multitude of LNAs) this invention functions as a multiplexed LNA and thus offers reduced area depending on the chosen topology. A few different topologies are discussed below. In some embodiments, area usage can be reduced by 75% or even more.

Second, power usage is reduced depending on topology as well. For large LNA arrays, the controller power becomes rather negligible. Unlike conventional quantum computer, where the LNAs are always powered on, a key aspect of some embodiments of the present disclosure is that the design allows turning off a multitude of LNAs (i.e., all of the LNAs associated with qubits that are not being read), so that they must not all be in the on-state. In this mode, the power saving depends on the usage rate of the quantum computer, which is something in the range 1-10%, meaning a 90-99% reduction of power in some embodiments.

Third, compared to a typical hardware multiplexed approach, embodiments of the present disclosure reduce losses by bypassing the need for a Mux circuit prior to the LNAs. RF Mux circuits are difficult to design and will invariably lead to performance losses, which these embodiments are able to avoid.

As discussed in more detail herein, embodiments of the present disclosure include a controller and a readout amplifier. The controller is a voltage controller with a certain set of properties, as described below. The readout amplifier has an input region or section, which includes a plurality of parallelized input stages, and a shared/common output stage. Different levels and types of parallelization of the readout amplifier are possible. It is to be understood that while three main embodiments of the readout amplifier are disclosed herein for illustrative purposes, other designs that would be recognized by persons of ordinary skill in the art and that are not otherwise inconsistent with the present disclosure are also contemplated.

The three main embodiments are a gate-parallelized design, a drain-parallelized design, and a non-parallelized design. Each design has different advantages and disadvantages when compared to each other. For example, the gate-parallelized design is the smallest design and has the largest power saving, but it requires all of the transistors in the inputs stages to share a drive bias. On the other hand, the drain-parallelized design requires more area and generally has a higher power usage, but the transistors are individually controllable. For example, in the drain-parallelized design, transistors can be turned off using either the gate or the drain, and each transistor can have a different bias.

Figure 11:
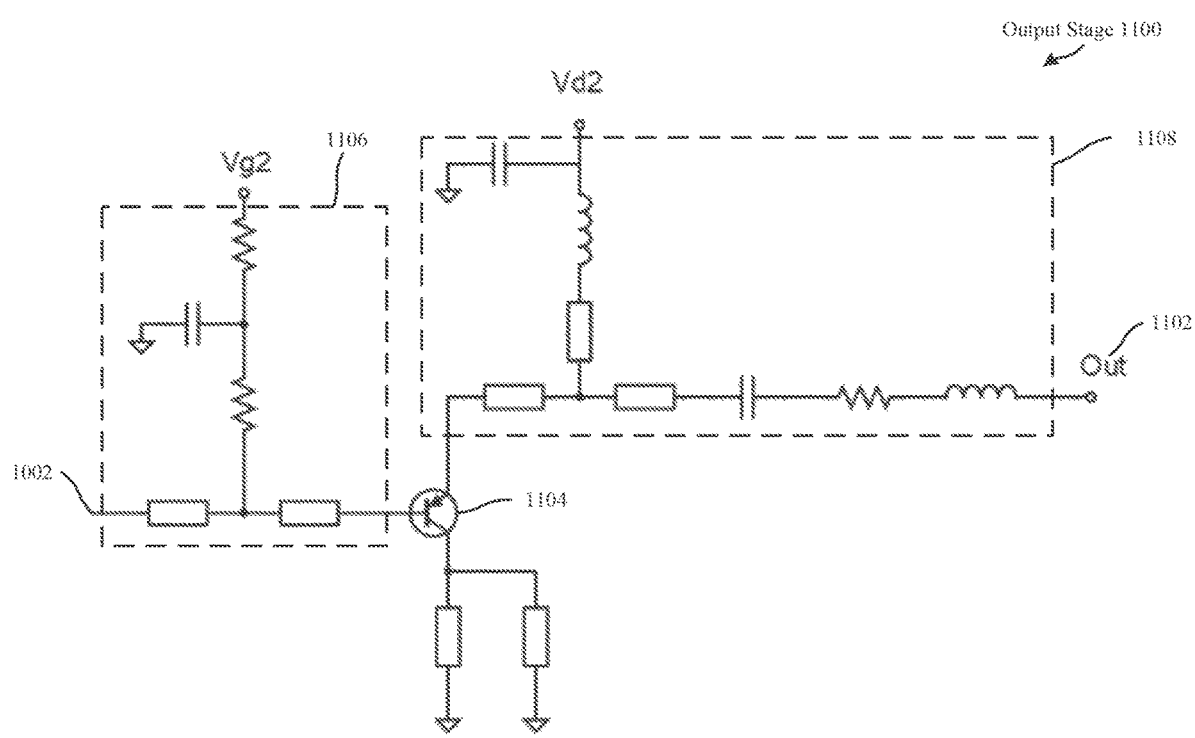
FIG. 11 illustrates a circuit diagram of an output stage for a readout amplifier, in accordance with the first set of embodiments of the present disclosure.
Figure 12:
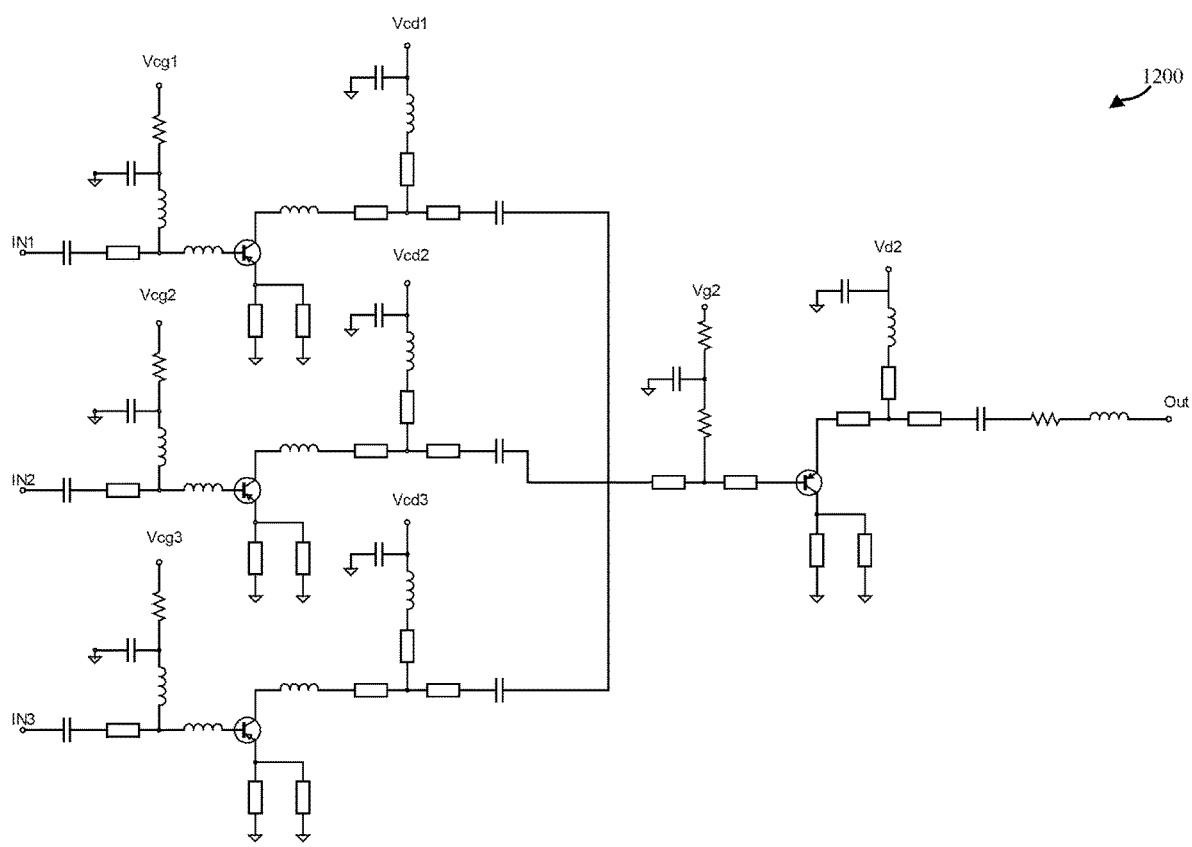
FIG. 12 illustrates a circuit diagram of a complete 3-input readout amplifier, in accordance with the first set of embodiments of the present disclosure.
Figure 13:
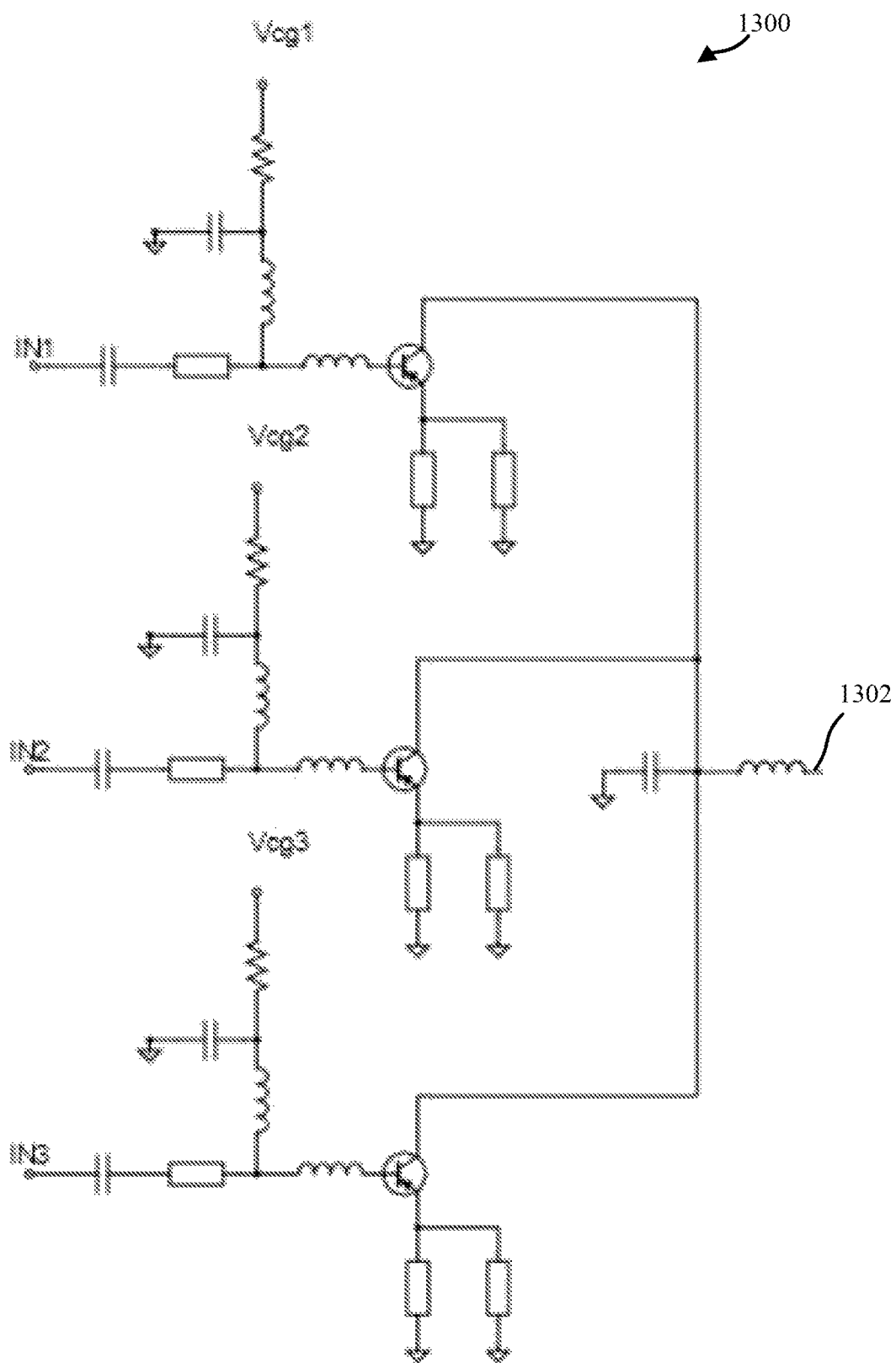
FIG. 13 illustrates a circuit diagram of an input stage for a 3-input readout amplifier, in accordance with a second set of embodiments of the present disclosure.
Figure 14:
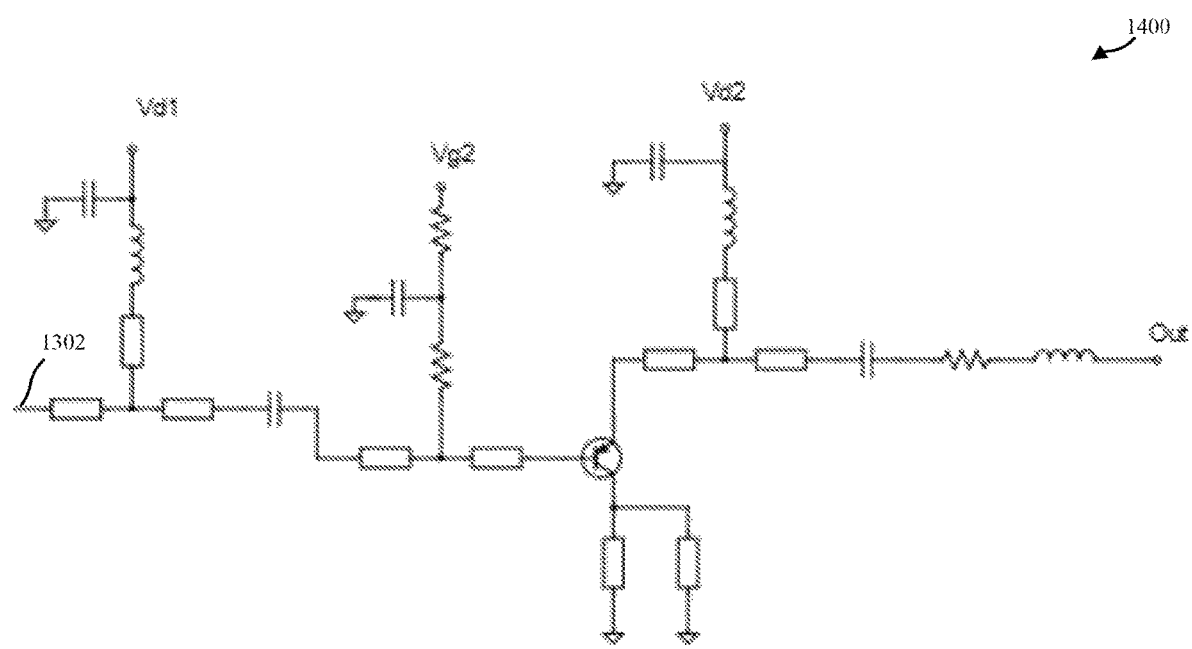
FIG. 14 illustrates a circuit diagram of an output stage for a readout amplifier, in accordance with the second set of embodiments of the present disclosure.
Figure 15:
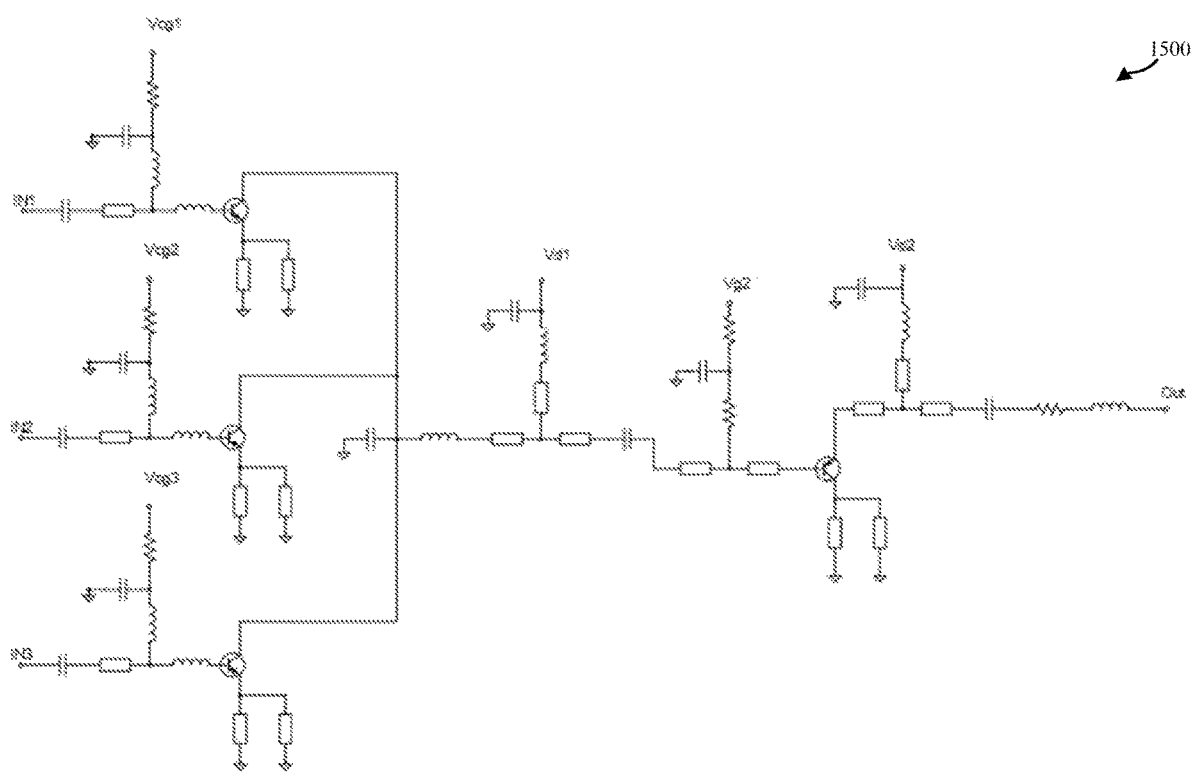
FIG. 15 illustrates a circuit diagram of a complete 3-input readout amplifier, in accordance with the second set of embodiments of the present disclosure.
Figure 16:
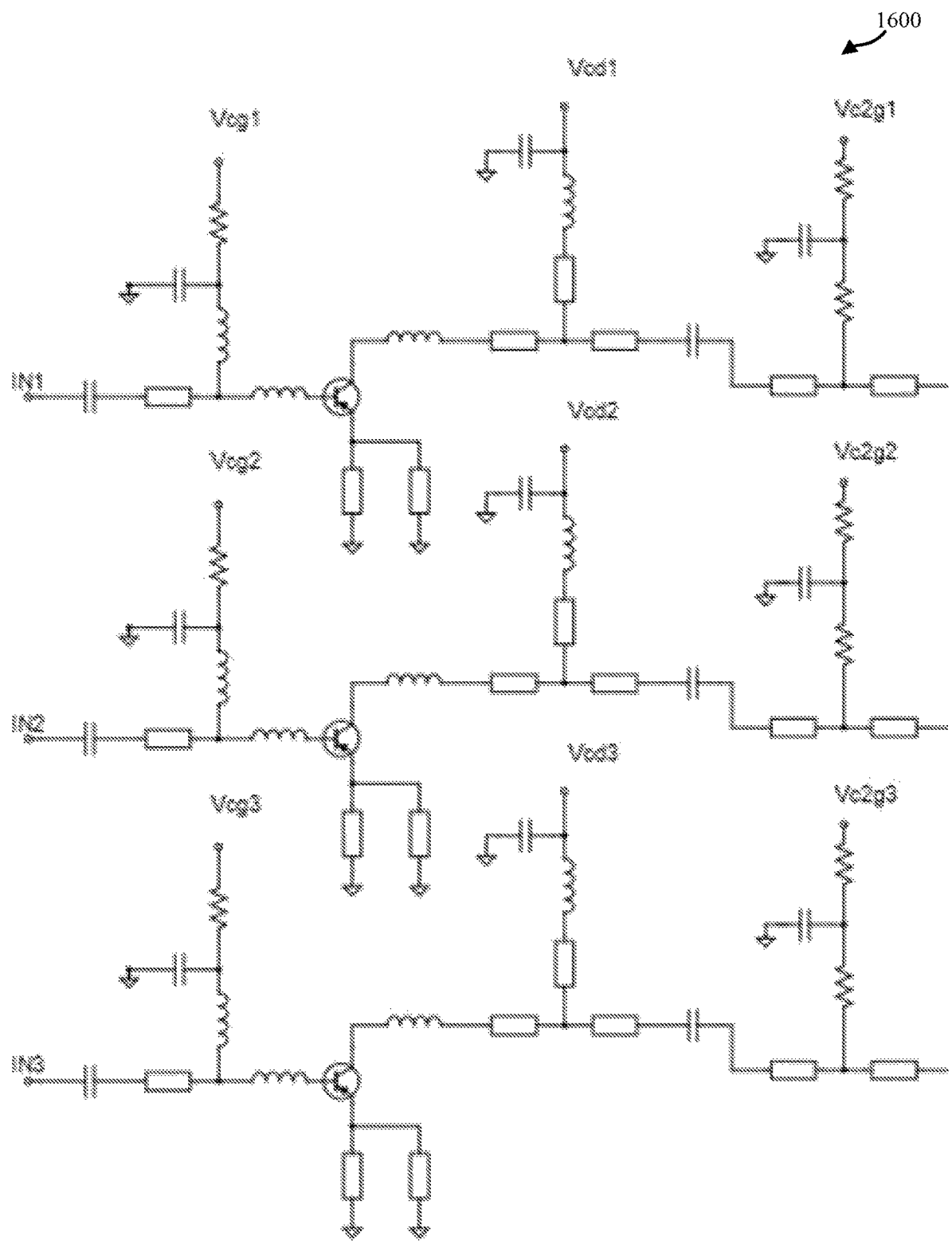
FIG. 16 illustrates a circuit diagram of an input stage for a 3-input readout amplifier, in accordance with a third set of embodiments of the present disclosure.
Figure 17:
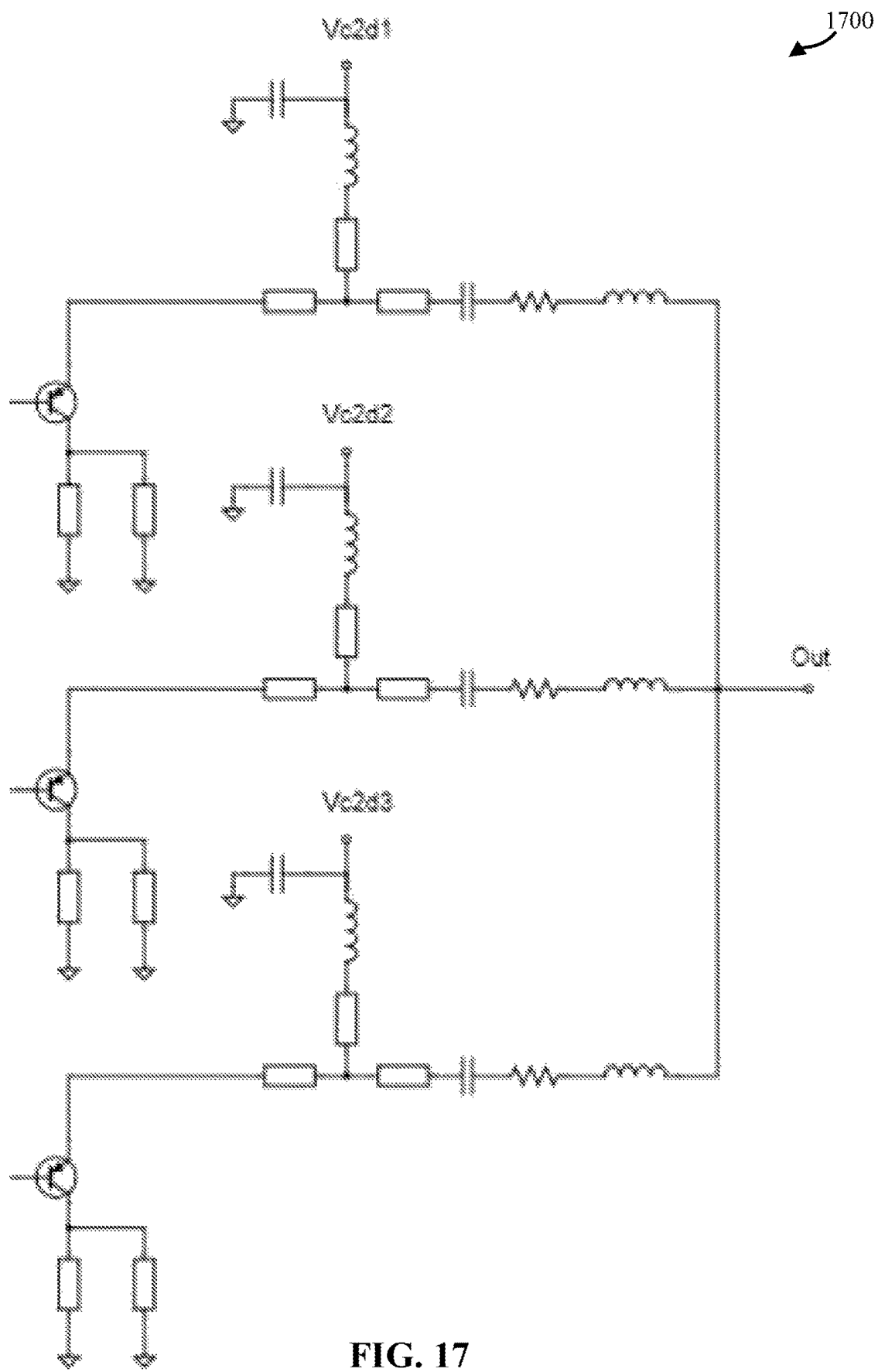
FIG. 17 illustrates a circuit diagram of an output stage for a readout amplifier, in accordance with the third set of embodiments of the present disclosure.
Figure 18:
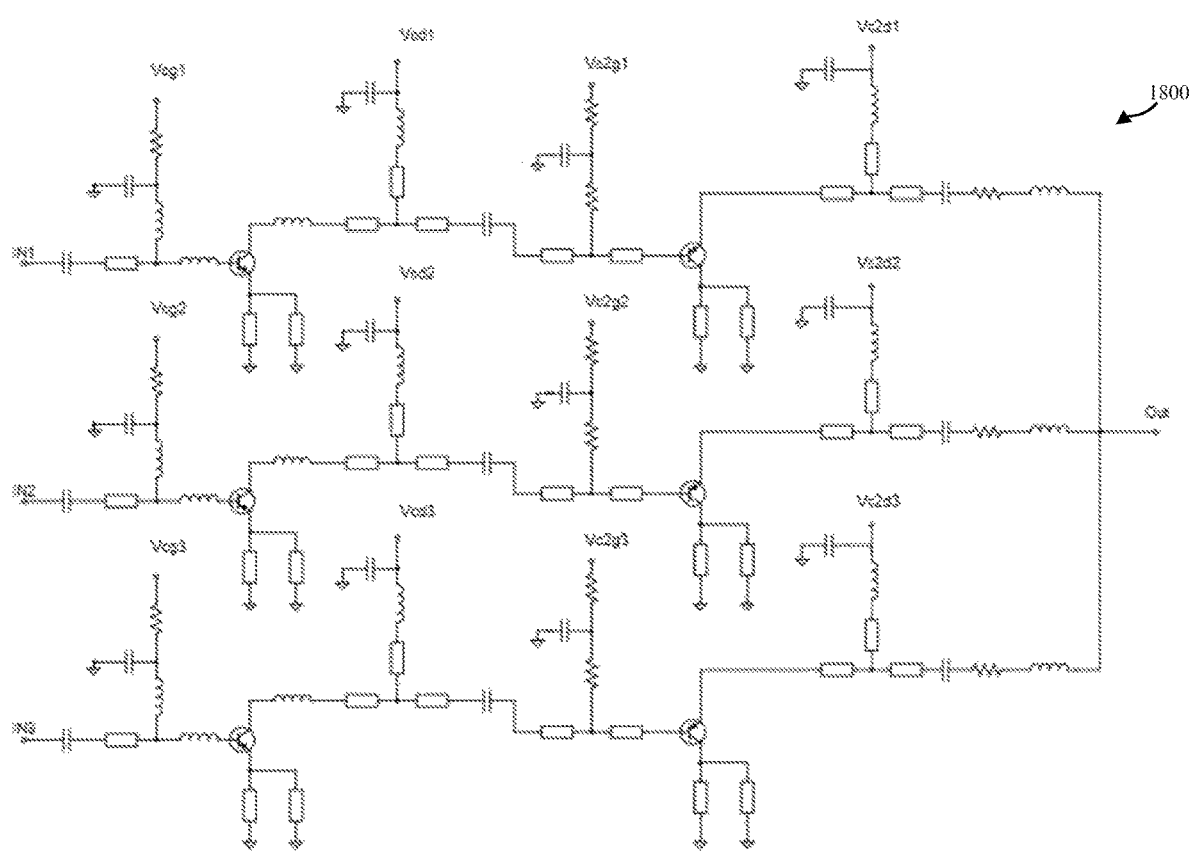
FIG. 18 illustrates a circuit diagram of a complete 3-input readout amplifier, in accordance with the third set of embodiments of the present disclosure.

An example of the gate-parallelized design is shown in FIGS. 9-12, an example of the drain-parallelized design is shown in FIGS. 13-15, and an example of a non-parallelized design is shown in FIGS. 16-18. Because the gate- and drain-parallelized designs share a single output among a plurality of inputs, the power and area savings scale with the number of input stages. Using the embodiments shown in FIGS. 9-18, the following area and power savings can be achieved, ignoring the controller power usage, which trends towards negligible for large quantum computers:

TABLE 1

| Area/Power Savings Compared to Non-Parallelized Design | | | |
|---|---|---|---|
| | Area/Power savings for 3 Input Stages | Area/Power savings for 10 Input Stages | Area/Power savings for 100 Input Stages |
| Gate-Parallelized | 50% | 67.5% | 75% |
| Drain-Parallelized | 33% | 45% | 50% |
| Non-Parallelized | 0% | 0% | 0% |

Some additional advantages of embodiments of the present disclosure include that the system works for any number of qubits. The system also does not require full integration of the control/readout chain; it will still be useful in less integrated system by simplifying the readout stage. Further, the embodiments are rather agnostic to the qubit technology (superconducting or spin) and can therefore be applied to different types of quantum computers. Additionally, typical quantum gate operations require only speeds in μS. Since LNAs are designed for GHz operation and can stabilize at few nanoseconds, embodiments of the present disclosure are more than fast enough to meet the speed requirements.

As discussed herein, by controlling each $v_{ds}$ of the LNAs, we can shut off the inactive LNAs, which gives a large power savings and offers better isolation (drain-parallelized design). Some embodiments can also simply control the static input point (gate-parallelized design). If the transistors are designed for off-state operation (i.e., with low off-state currents), then this also offers good isolation and power saving, and can be further parallelized to reduce area.

It is to be understood that the aforementioned advantages are example advantages and should not be construed as limiting. Embodiments of the present disclosure can contain all, some, or none of the aforementioned advantages while remaining within the spirit and scope of the present disclosure.

In the following, an implementation is described that relies on fixed-frequency, superconducting qubits, for the sake of illustration. However, one skilled in the art will appreciate that the scope of the present disclosure is not limited to fixed-frequency qubits. Furthermore, the example of system implementation illustrated in the accompanying drawings assumes a frequency-multiplexed qubit application using a ratio of 1:10. Still, the skilled person will appreciate that the present concepts may also be used to maintain coherent control over a large and/or distributed quantum computing system, including many qubits and having the same or different multiplexing ratios. In such systems, time division multiplexing may be used to drive several signals and thus several qubits.

More generally, however, one can also work in a frequency multiplexed scheme to access more than one qubit at the same time. Thus, time and/or frequency multiplexing schemes having any suitable ratio are contemplated, which may dramatically reduce the need for hardware (e.g., cabling) and hardware control in practice.

Turning now to the figures, FIG. 1 illustrates a block diagram of an example computing environment 100 in which illustrative embodiments of the present disclosure may be implemented. The computing environment 100 in FIG. 1 includes a computer 102, which may be a conventional computer system such as, but not limited to, a desktop PC, laptop, and/or server computer. Additionally, the computing environment 100 includes a quantum computer 104. The quantum computer 104 may be communicatively couple to the computer 102 using any suitable communications network (not shown) (e.g., a LAN, a WAN, hardwired, wireless, etc.).

The quantum computer 104 is largely broken down into two set of components: the room temperature electronics 106 and the low temperature electronics 108. As shown in FIG. 1, the room temperature electronics 106 and the low temperature electronics 108 are communicatively coupled to each other. The room temperature electronics 106 are discussed in more detail in reference to FIG. 2, while the low temperature electronics are discussed in more detail in reference to FIG. 3.

While FIG. 1 illustrates a computing environment 100 with a single computer 102 and a single quantum computer 104, suitable computing environments for implementing embodiments of this disclosure may include any number of conventional computers and quantum computers. The various models, modules, systems, and components illustrated in FIG. 1 may exist, if at all, across a plurality of conventional computers and quantum computers. For example, some embodiments may include two quantum computers. The two quantum computers may be communicatively coupled using any suitable communications connection (e.g., using a WAN, a LAN, a wired connection, an intranet, or the Internet).

It is noted that FIG. 1 is intended to depict the representative major components of an exemplary computing environment 100. In some embodiments, however, individual components may have greater or lesser complexity than as represented in FIG. 1, components other than or in addition to those shown in FIG. 1 may be present, and the number, type, and configuration of such components may vary.

Figure 2:
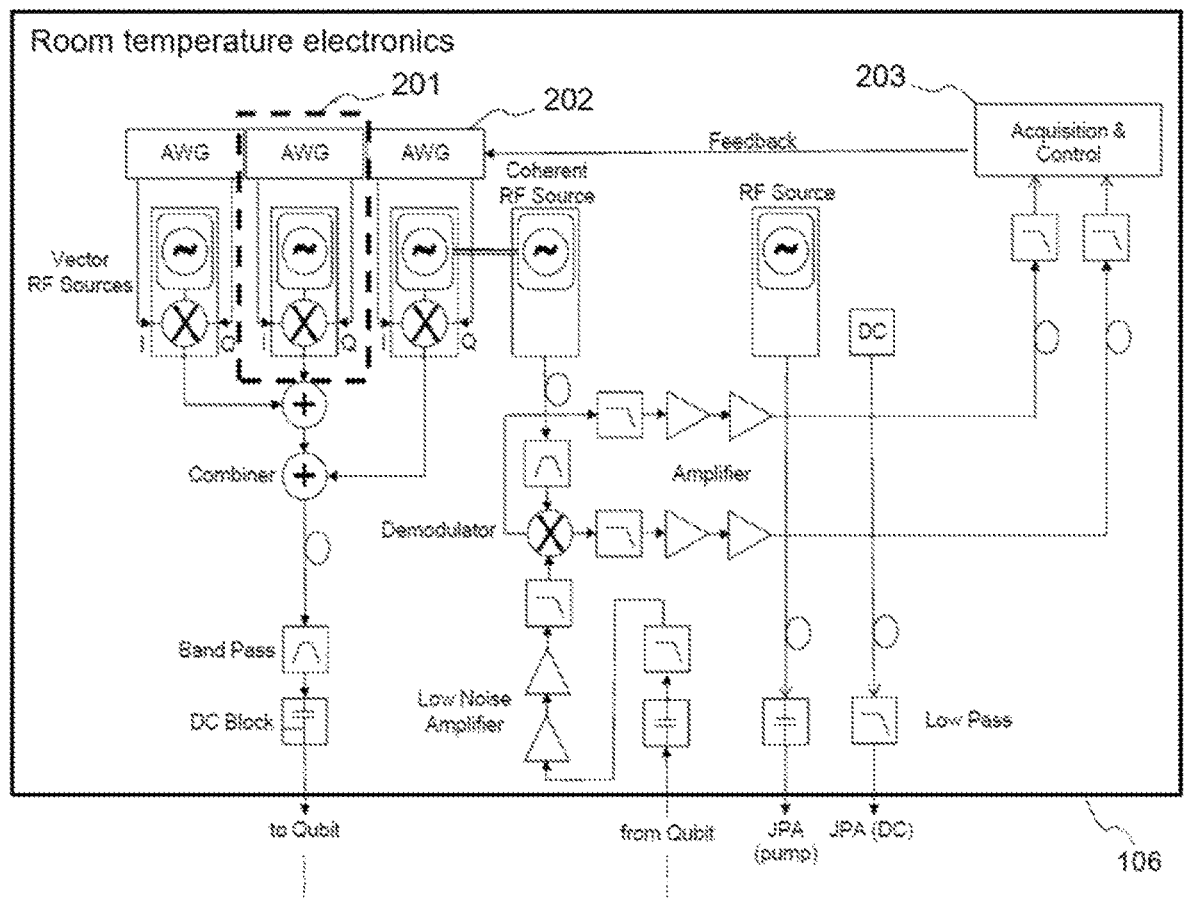
FIG. 2 illustrates a block diagram of an example electronic circuit that can be operated with a room temperature portion of a quantum computer, in accordance with embodiments of the present disclosure.

FIG. 2 shows possible driving electronics for a single set of multiplexed qubits, including two-channel arbitrary waveform generators (AWGs), which can be connected to an I/Q sideband modulator (not shown) integrated in the vector RF sources, in accordance with embodiments of the present disclosure. Because of the different resonance frequencies required for a qubit and its coupling resonator, more than one AWG—vector RF source channels are required. These channels are usually added onto a single signal by means of combiners, as assumed in FIG. 2. Note, the dashed, rectangular box 201 of FIG. 2 refers to RF generation units (here AWGs combined with vector RF sources). Not all components of such units are shown in FIG. 2.

As also shown in FIG. 2 (on the path down to 'to qubit'), the RF signals may optionally be filtered and DC blocked or DC shifted. Further down this path ('to Qubit'), the signals enter the cryostat 108 (the signal path continues on FIG. 3). At the bottom of FIG. 2, 'from qubit' denotes the return signal (from FIG. 3) that can be used to read-out the qubit. The modulated RF signal first passes some optional DC blocks, filters, and low noise amplifiers (LNA). In the depicted example, the read-out signal is demodulated by a heterodyne I/Q method. Therefore, an RF source is held coherent with the read-out driving AWG—vector RF source, as shown above the demodulator ('Demodulator'). The demodulator subtracts the RF carrier frequency of the corresponding read-out driving vector RF source from the signal and outputs the I and Q signals. Such signals relate to the two AWG channels of the read-out driving unit, where only the Q signal is used to switch on and off the read-out function.

Depending on whether the qubit is in its ground state or not, a small difference in the amplitude and phase can be obtained in the I/Q plane. This is typically processed in the acquisition and control unit 203, shown in the top-right corner of FIG. 2. This unit may send events back to the AWG—vector RF sources to drive actions, such as qubit error corrections. FIG. 2 shows additional RF sources and a DC source, as may be required inside the cryostat.

Figure 3:
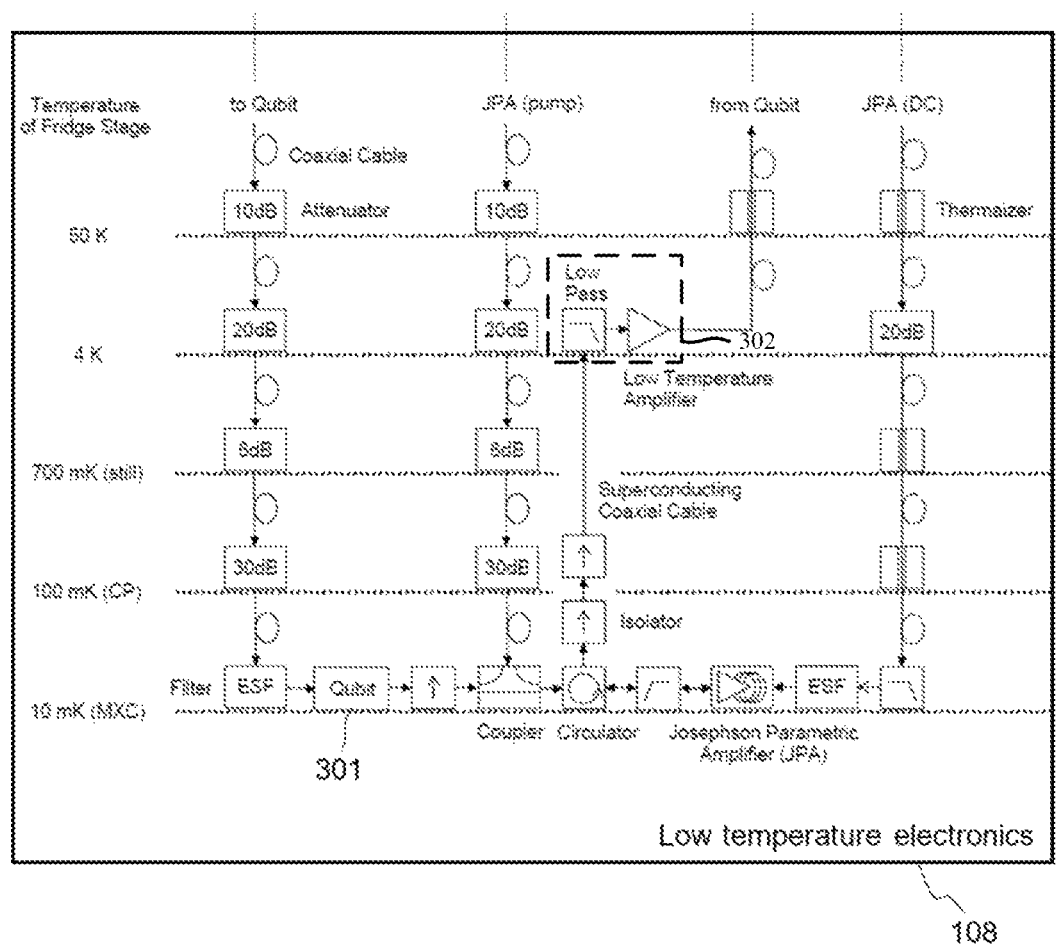
FIG. 3 illustrates a block diagram of an example electronic circuit that can be operated within a cryostat portion of a quantum computer, in accordance with embodiments of the present disclosure.

In the top-left corner of FIG. 3, the 'to Qubit' signal enters the cryostat and runs through attenuators on all the different cooling stages (50 K, 4 K, etc.) down to the 10 mK plate that supports the qubit(s). Attenuators are normally required to thermalize the coaxial conductors and keep the signal-to-noise ratio as high as possible when lowering the signal level, similar to the standard signal path for an initialization gate or any functional gate operation. In case of a read-out operation, the signal leaves the qubit read-out resonator to the right and reaches an isolator. The output signal continues via a directional coupler, where pump power for a Josephson parametric amplifier (JPA) is added, connected via a circulator and a filter to the JPA. The JPA enhances the signal by about 20 dB and reflects it back to the circulator. The circulator is routing the output signals up through the isolators and the low-pass filter to the low temperature amplifiers (LTAs), also referred to herein as the low noise amplifiers (LNAs) 302. Thereafter, the signal leaves the cryostat (see 'from Qubit') to enter FIG. 2.

As discussed in more detail herein, the LNAs 302 may be part of a readout system that comprises a logic controller and a parallelized LNA array. Each LNA 302 in the LNA array comprises one or more transistors and passive components (e.g., resistors, capacitors, inductors). The transistors may be, for example, high-electron-mobility transistors (HEMTs). In some embodiments, each LNA 302 in the LNA array shares a common output circuit. In other words, each LNA 302 may essentially comprise an input stage of a 2-stage amplifier, with a common output stage being shared by all of the LNAs. This can reduce both the area taken up by the LNA array and the amount of power used by the LNA array, which may be particularly beneficial given that the LNA array exists inside the cryostat and must be kept to a temperature of no more than 4 K.

Each controllable qubit 301, or group of qubits sharing one line via frequency division multiple access (FDMA), is connected to an input on the LNA array. The logic controller, which may be located inside the cryostat at the 4 K region or, in some embodiments, in the room temperature portion of the quantum computer, then rapidly switches on and off the LNAs to read out the target qubit. Accordingly, the readout system is able to use the switching of the LNAs to implement a MUX implicitly through rapid on/off operation using a logic controller.

Figure 4:
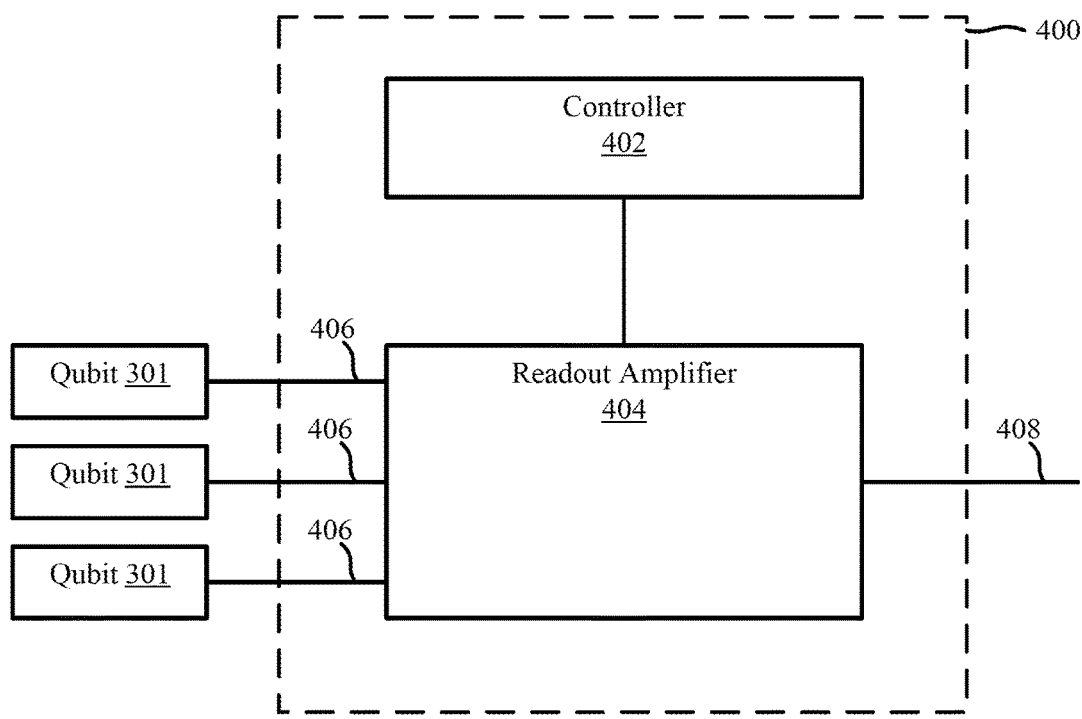
FIG. 4 illustrates a block diagram of an example readout system for a quantum computer, in accordance with embodiments of the present disclosure.

Referring now to FIG. 4, illustrated is a high-level block diagram of an example readout system 400 for a quantum computer, in accordance with embodiments of the present disclosure. As shown in FIG. 4, the readout system 400 includes a controller 402 communicatively coupled to a readout amplifier 404. The controller 402 is a mixed signal element that defines bias setting within approximately one microsecond. (e.g., between 10 ns-10 us). Controller will provide the gate and drain voltage and current. The current may be in the mA range. Additionally, in some embodiments, the power will be in the mW range matching LNA power, with 10-20% overhead. Thus for large LNA arrays, the controller 402 power is negligible (1-10% of total power).

The controller 402 can be outfitted with a memory to store a preloaded readout routine, which must be synchronized with the qubit control signal transmit side. The controller's 402 settling time needs to be matching the gate operation speed. Because the system is running relatively high currents, in the order of few mA, charging will be fast.

Charge injection is one of the main concerns that applies to standard MUX schemes close to qubits. In some embodiments of the present disclosure, the controller 402 is located at the 4 K cryostat stage after a circulator/isolator, which will protect the qubits from charge injection. Additionally, some embodiments may integrate active isolators at each readout channel monolithically. Finally, cryogenic HEMTs are optimized to run at minimum gm/Ids, operating typically with supply voltages of 100-200 mV and low levels of current. Thus, charge injection will be reduced compared to room temperature operation.

The readout amplifier 404 is further coupled to a plurality of qubits 301 via input lines 406. As discussed herein, the readout amplifier 404 comprises a plurality of input stages (one for each qubit, in this example) that are individually selectable by the controller 402. The signal from the selected input stage is amplified by the readout amplifier 404, and the amplified signal is output 408 to other computer logic, such as the room temperature computer logic.

Figure 5:
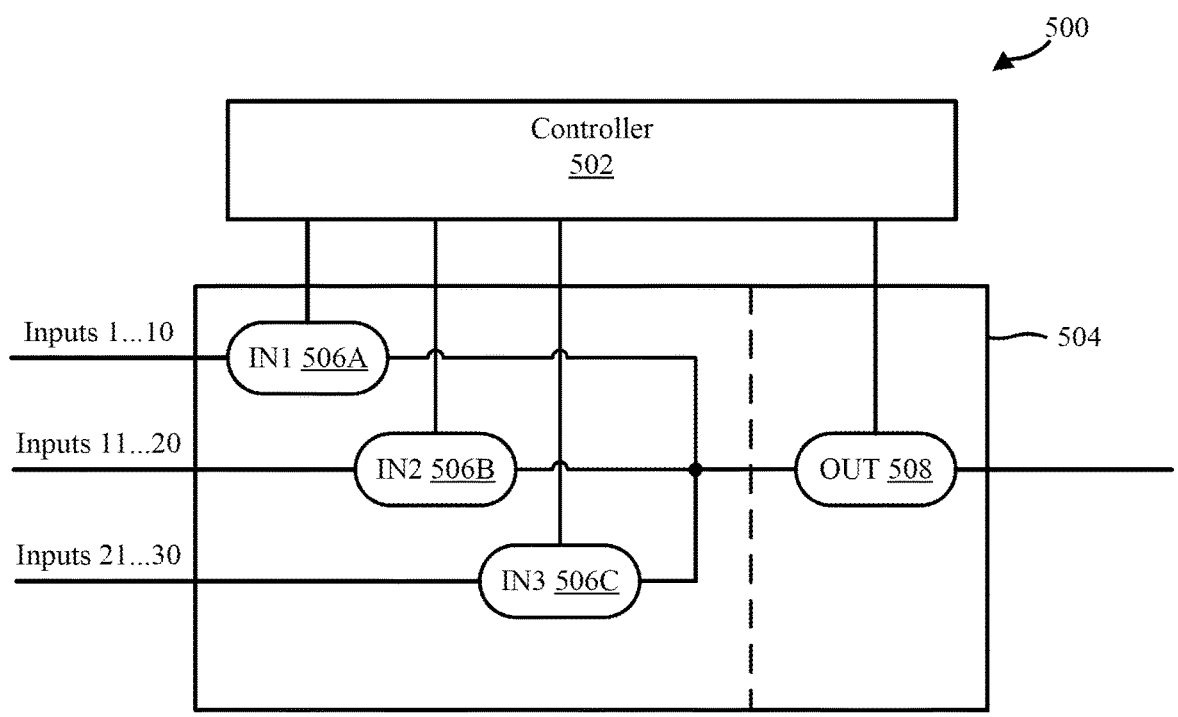
FIG. 5 illustrates a block diagram of a second example readout system for a quantum computer, in accordance with embodiments of the present disclosure.

Referring now to FIG. 5, illustrated is a second block diagram of an example readout system 500 for a quantum computer, in accordance with embodiments of the present disclosure. Like the readout system 400 discussed above with respect to FIG. 4, the readout system 500 includes a controller 502 and a readout amplifier 504. As shown in FIG. 5, the readout amplifier 504 is a 3-input readout amplifier that also uses frequency multiplexing with a 1:10 ratio.

Accordingly, the readout amplifier has three input stages 506A, 506B, and 506C (collectively and/or individually referred to as input stage(s) 506) and one output stage 508. The dashed line illustrates the separation of the input and output regions/sections. Each input stage 506 is connected to the controller 502 and to a set of ten qubit inputs using frequency multiplexing. The controller 502 can select a specific qubit (or set of qubits) to be read by sending an on signal to the corresponding input stage 506 and an off signal (or no signal) to the other input stages 506. For example, when the controller 502 wants to read out one of inputs 1-10, the controller 502 can send an on signal (e.g., a positive voltage) to the first input stage 506A (e.g., to the transistor(s) in the first input stage 506A) and an off signal (e.g., no voltage) to the second input stage 506B and the third input stage 506C. The controller 502 can also send an on signal to the output stage 508. This will cause the value from inputs 1-10 to be read and amplified before being transmitted to the room temperature electronics for additional processing. The controller 502 can rapidly switch which input stages 506 are being activated, thereby essentially acting as a Mux without the complicated RF Mux hardware or the losses inherent in using Muxes.

As shown in FIG. 5, instead of requiring three full LNAs (one for each set of inputs), embodiments of the present disclosure are able to share part of the circuitry (the output stage 508) among the LNAs. This reduces the area and power requirements when compared to traditional LNA circuitry. In addition, unlike traditional LNA circuitry, the controller 502 is able to selectively turn off LNAs that are not needed by, for example, turning off the input stages 506 that are not being used. While this does require a controller 502, which has its own power usage, the power savings from only running one input stage at a time more than cancels out the relatively small power required by the controller 502, which can be a simple voltage controller. Additionally, the area savings from sharing a common output stage 508 more than makes up for the additional area required by the controller 502, even in embodiments where the controller 502 is in the cryostat.

Furthermore, because multiple LNAs share a single output stage 508, the number of cables that have to leave the cryostat can be reduced. For example, in a tradition circuit that uses three LNAs, each LNA may have its own cable to runs to, for example, a Demux in the room temperature region. In contract, embodiments of the present disclosure, which perform the signal switching in the cryostat region, only need a single cable to handle all three LNAs. This reduces the amount of cabling that needs to be run in the quantum computer, as well as the amount of heat the is carried by cables into the cryostat.

Figure 6:
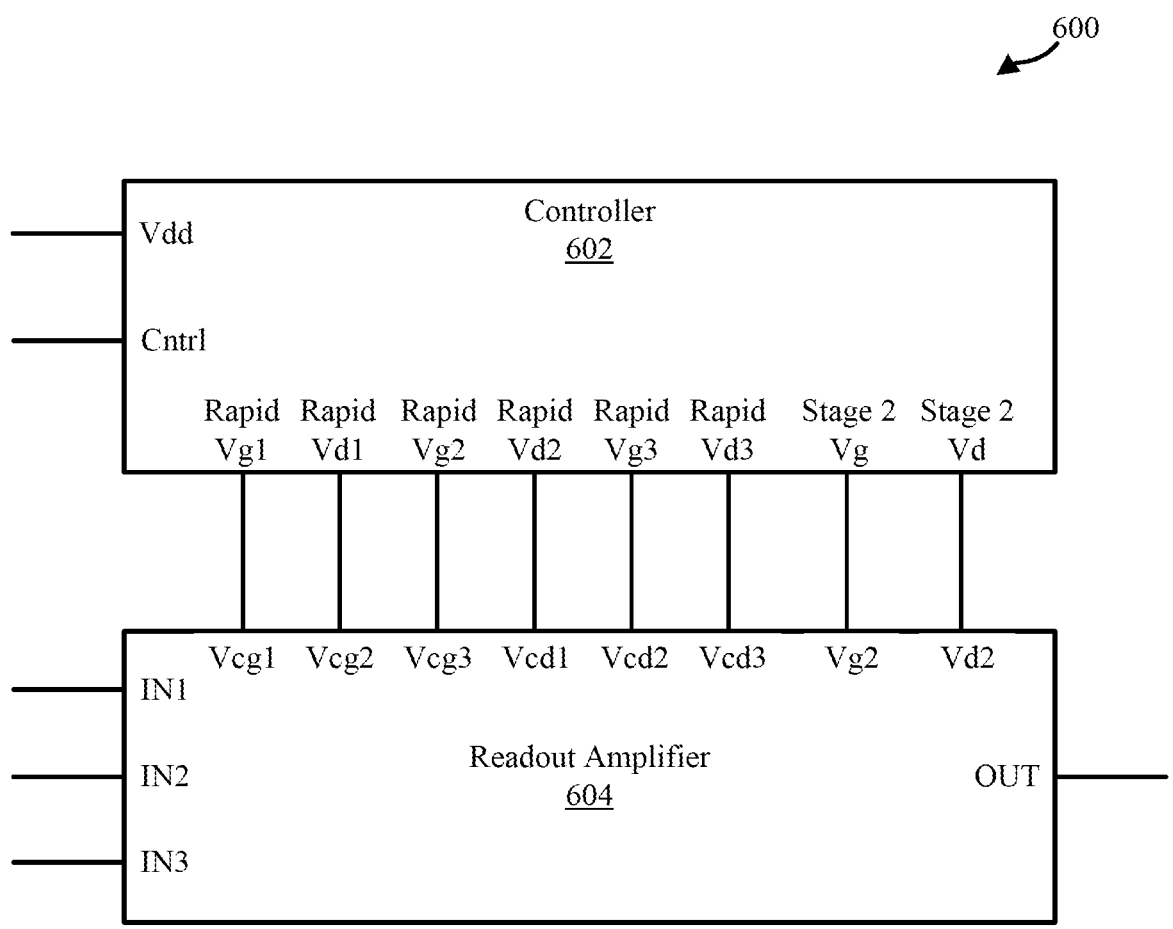
FIG. 6 illustrates a block diagram of a third example readout system for a quantum computer, in accordance with embodiments of the present disclosure.

Referring now to FIG. 6, illustrated is a block diagram of an example readout system 600 for a quantum computer, in accordance with embodiments of the present disclosure. In particular, FIG. 6 shows a simplified wiring diagram illustrating the connection into and out of the controller 602 and readout amplifier 604 for a 3-input readout system 600 implementing a drain-parallelized design.

The voltage controller 602 implements the rapid-on logic. It takes the Cntrl logic input and selects a set of output pins to activate (e.g., drive to a predetermined DC voltage) based on the Cntrl input. The readout amplifier 604 takes a multitude of qubit readout signals (IN1, IN2, IN3) and outputs the selected readout signal, based on which of its internal circuits are powered by the controller, amplified at one output (OUT). As discussed herein, embodiments of the present disclosure have the functionality of a multiplexed LNA. However, instead of multiplexing, the invention rapidly turns the LNAs on and off. This avoids the losses and complexity associated with high-frequency multiplexing.

Figure 7:
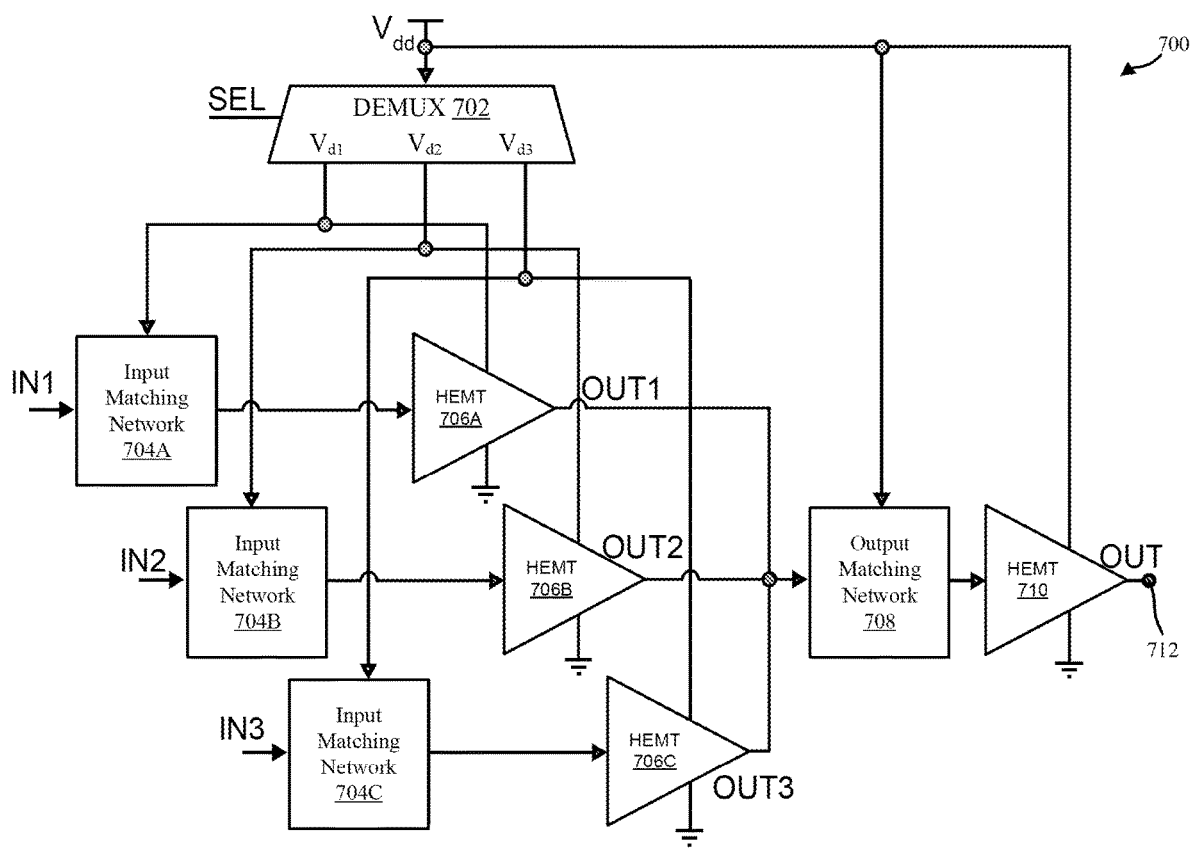
FIG. 7 illustrates a block diagram of a fourth example readout system for a quantum computer, in accordance with embodiments of the present disclosure.

Referring now to FIG. 7, illustrated is a block diagram of an example readout system 700 for a quantum computer, in accordance with embodiments of the present disclosure. The readout system 700 of FIG. 7 may be a simple, 3-input readout system 700. In this simplified readout system 700, the voltage controller is a Demux 702. The Demux 702 is configured to select an input by transmitting a voltage to one of three different input matching networks 704A, 704B, and 704C, depending on which input stage is to be selected. The same voltage is also applied to one of three HEMTs 706A, 706B, 706C. The input matching networks 704A-C and the output matching network 708 may consist of a plurality of passive components, such as resisters, capacitors, and inductors, as well as connections to, for example, ground.

For example, if the first input stage is to be selected, the Demux 702 applies a voltage $V_{d1}$ to the first input matching network 704A and the first HEMT 706A, while the other input matching networks and HEMTs remain off. In addition, a voltage $V_{dd}$ powers the output matching network 708 and the output HEMT 710. As a result, a qubit that is connected to the first stage is amplified and transmitted as output 712 to other computer logic, such as the room temperature computer logic.

Figure 8:
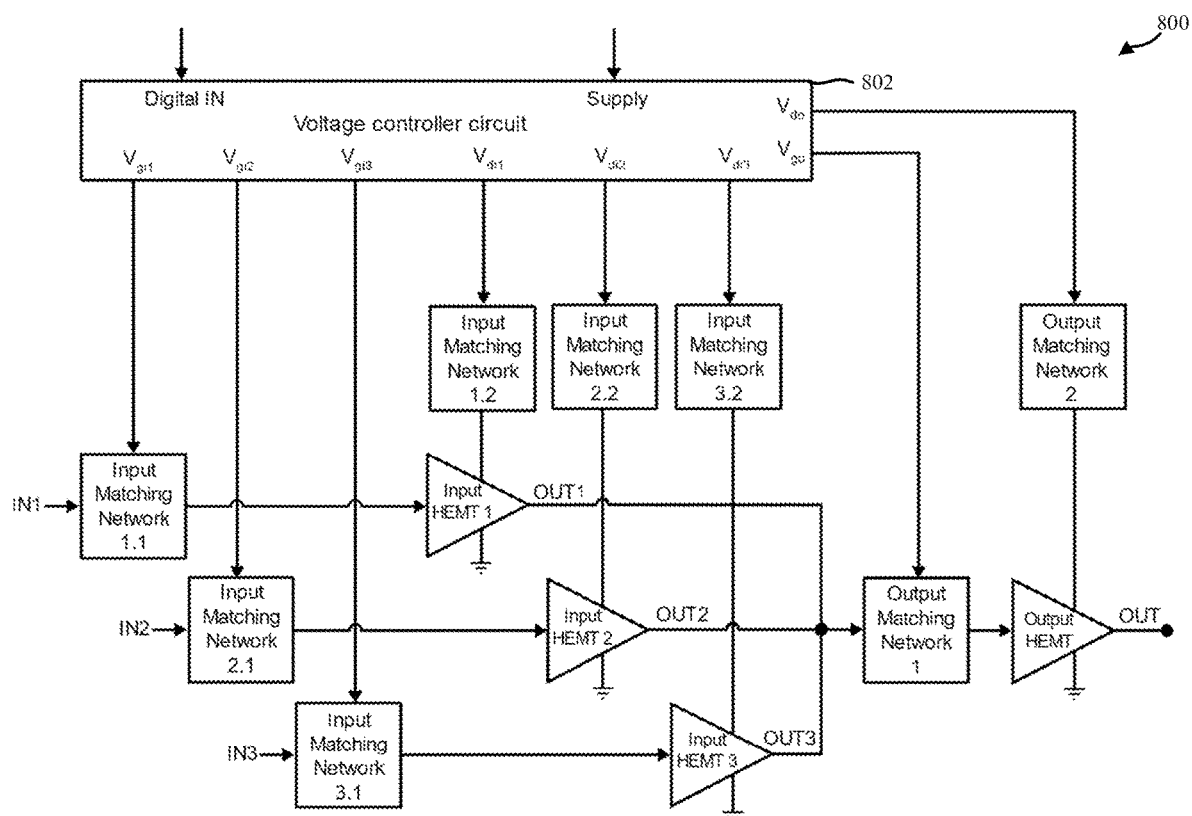
FIG. 8 illustrates a block diagram of a fifth example readout system for a quantum computer, in accordance with embodiments of the present disclosure.

Referring now to FIG. 8, illustrated is a block diagram of an example readout system 800 for a quantum computer, in accordance with embodiments of the present disclosure. The readout system 800 of FIG. 8 may be a 3-input readout system 800 in which the HEMTs are powered at both their gates and drains. For example, the readout system 800 may illustrate a block diagram of a gate-parallelized design, such as the one shown in FIGS. 9-12.

The readout system 800 includes a voltage controller 802 and a plurality of input matching networks, HEMTs, and output matching networks. The voltage controller 802 may be connected to each stage via two output signals. The output pins of the voltage controller 802 that supply the input stages are labeled as Vgin and Vdin, where 'g' indicates that the output pin is connected to the gate of a HEMT, 'd' indicates that the output pin is connected to the drain of the HEMT, and 'n' indicates the input stage number. The connections to the input stages may be made through a set of input matching networks (i.e., a set of passive components). The input matching networks are labeled in FIG. 8 as "Input Matching Network m.n," where 'm' is an integer that denotes the input stage number and 'n' indicates whether the pin is connected to the gate (e.g., for n=1) or the drain (for n=2) of the corresponding HEMT.

For example, the voltage controller 802 is connected to the first input stage via output pins Vgi1 and Vdi1, with Vgi1 being connected to the gate of the first input transistor HEMT 1 through a first input matching network 1.1 and Vdi1 being connected to the drain of the first input transistor HEMT 1 through a second input matching network 1.2.

Additionally, the voltage controller 802 is connected to an output HEMT via two different pins. A first pin labeled Vg0 is connected to the gate of the output HEMT via a first output matching network, and the second pin labeled Vd0 is connected to the drain of the output HEMT via the second output matching network.

The voltage control may receive a digital signal in the Digital IN pin and a supply voltage at the Supply pin. The Digital IN selects one of the LNAs to activate. For example, the Digital IN signal will select Vd0 and Vg0, which is the shared output stage, as well as one of {Vgi1, Vdi1}, {Vgi2, Vdi2}, and {Vgi3, Vdi3}. As discussed herein, "selecting" one of the LNAs will set the corresponding pair of pins (e.g., Vgi1 and Vdi1) to predefined DC levels, and it will set all of the other input stage pins to 0 V.

Figure 9:
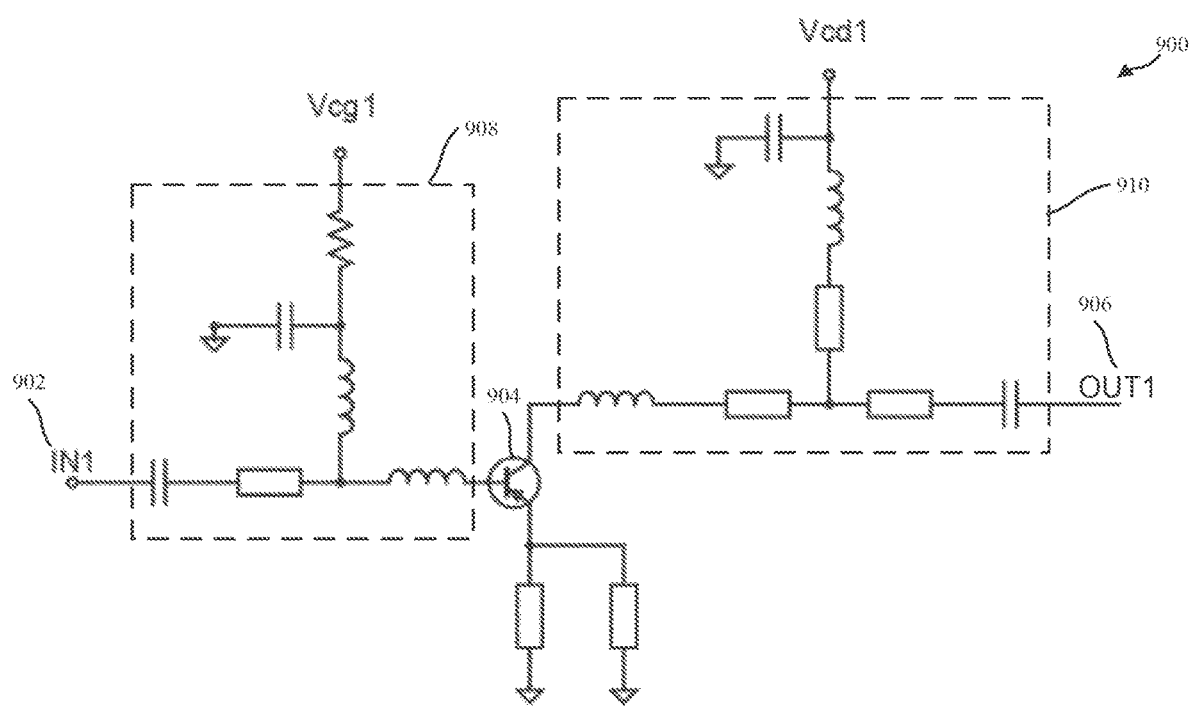
FIG. 9 illustrates a circuit diagram of a single input stage of a readout amplifier, in accordance with a first set of embodiments of the present disclosure.

Referring now to FIGS. 9-12, shown are circuit diagrams of a gate-parallelized readout amplifier. Starting with FIG. 9, shown is a circuit diagram of a single stage LNA 900, which is not parallelized. The single stage LNA 900 may act as a single input stage for a parallelized readout amplifier, as shown in subsequent figures. As shown in FIG. 9, the LNA 900 includes an input line 902 whereby the LNA 900 is connected to, and receives information from, one or more qubits. The input line 902 may be frequency multiplexed such that a plurality (e.g., 10) of qubits share the same input line 902. The LNA 900 further includes a transistor 904, such as an HEMT, and a stage output line 906. The stage output line 906 connects the LNA 900 to the common, or shared, output stage for the LNA.

In addition, the LNA 900 includes two matching networks 908 and 910. The input matching network 908 is a set of passive components that are between the input gate voltage Vcg1 and the gate of the transistor 904. Similarly, the second output matching network 910 is a set of passive components that are between the drain voltage Vcd1 and the drain of the transistor 904. These matching networks ensure that the LNA 900 has the target output and input impedances.

Figure 10:
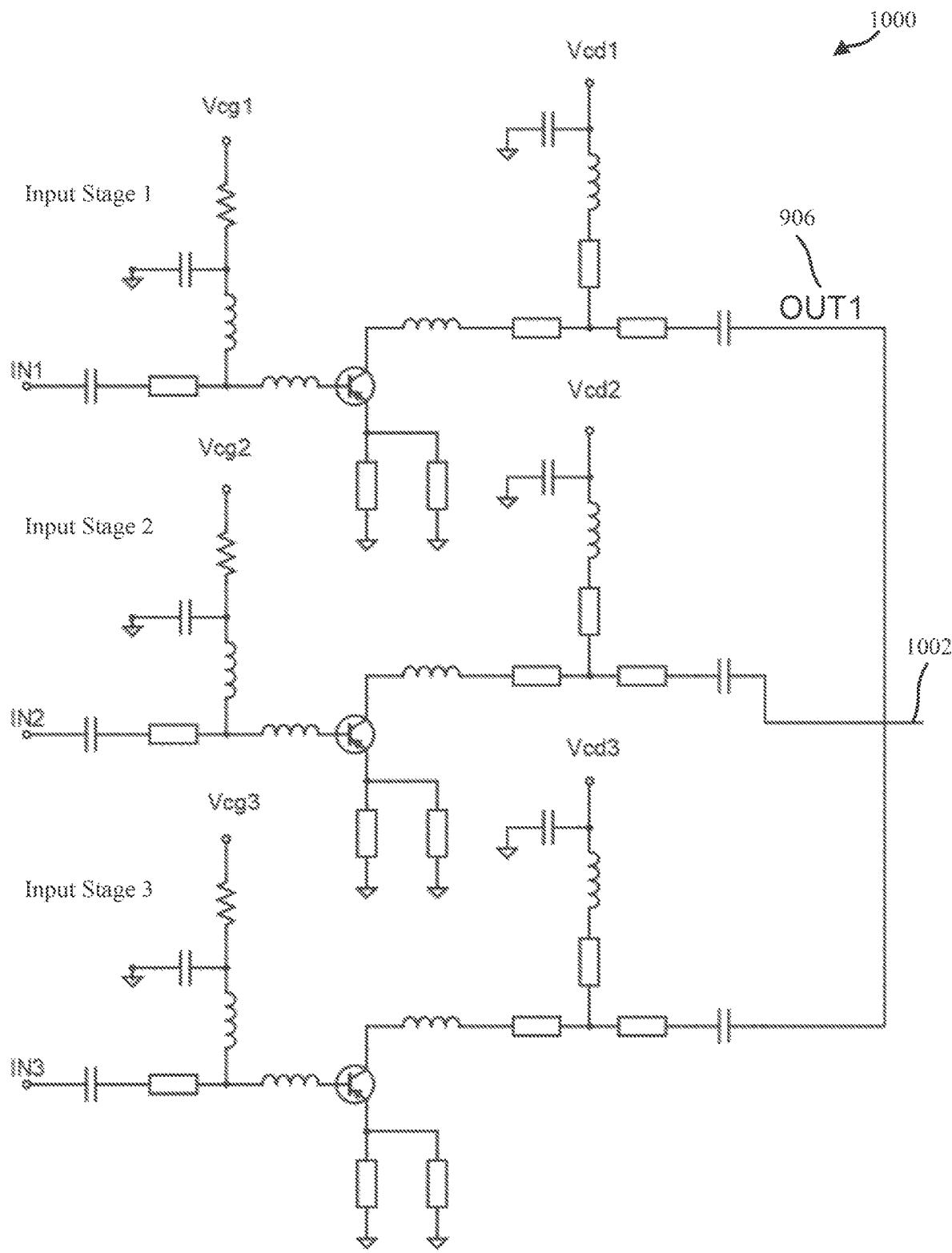
FIG. 10 illustrates a circuit diagram of an input stage for a 3-input readout amplifier, in accordance with the first set of embodiments of the present disclosure.

Referring now specifically to FIG. 10, shown is the entire set of parallelized input stages 1000, in accordance with embodiments of the present disclosure. In particular, FIG. 10 shows a circuit diagram for a 3-input readout amplifier. However, it is to be understood that the number of input stages can be freely scaled based on the needs of the quantum computer. Accordingly, embodiments of the present disclosure may have fewer (e.g., 2) or more (e.g., 10) input stages. The stage outputs (e.g., stage output 906) of all of the input stages merge together to form a single output signal 1002 for the set of input stages 1000. Because two of the input stages will be turned off at any given time, the output signal 1002 will be the same as one of the stage output signals. For example, if the first input stage is selected, the output signal 1002 will be the same as the stage output 906.

Referring now to FIG. 11, shown is a circuit diagram of a common, or shared, output stage 1100 of the gate-parallelized readout amplifier. As shown, the output stage 1100 includes an input line 1002, which is the output from the input stages 1000 shown in FIG. 10. The output stage 1100 further includes a transistor 1104, such as an HEMT, and a LNA output line 1102. The LNA output line 1102 connects the LNA to external circuitry, such as the room temperature electronics.

In addition, the output stage 1100 includes two output matching networks 1106 and 1108. The first output matching network 1106 is a set of passive components that are between the output gate voltage Vg2 and the gate of the transistor 1104. Similarly, the second output matching network 1108 is a set of passive components that are between the drain voltage Vd2 and the drain of the transistor 1104. The first input matching network 1106 may filter the input signal and apply a bias voltage to match the threshold of the transistor. The second input matching network 1108 consists of the sourcing path of the transistor. The passive components close to Vg2 an Vd2 are designed to supply noise reduction.

A complete 3-input, gate-parallelized readout amplifier circuit 1200 is shown in FIG. 12. As discussed above, the input stages are parallelized while output stage is shared.

This gives an area save approaching 50% for a system with a larger number of input stages.

Referring now to FIGS. 13-15, shown are circuit diagrams of a drain-parallelized readout amplifier. Starting with FIG. 13, shown is the entire set of parallelized input stages 1300, in accordance with embodiments of the present disclosure. In particular, FIG. 13 shows a circuit diagram for a 3-input readout amplifier. However, it is to be understood that the number of input stages can be freely scaled based on the needs of the quantum computer. Accordingly, embodiments of the present disclosure may have fewer (e.g., 2) or more (e.g., 10) input stages. The stage outputs of all of the input stages merge together to form a single output signal 1302 for the set of input stages 1300. Because two of the input stages will be turned off at any given time, the output signal 1302 will be the same as one of the stage output signals. For example, if the first input stage is selected, the output signal 1302 will be the same as the stage output for the first stage.

Referring now to FIG. 14, shown is a circuit diagram of a common, or shared, output stage 1400 of the gate-parallelized readout amplifier. As shown, the output stage 1400 includes an input line 1302, which is the output from the input stages 1300 shown in FIG. 13. The output stage 1400 further includes a transistor, such as an HEMT, and a LNA output line (labeled Out). The LNA output line connects the LNA to external circuitry, such as the room temperature electronics.

A complete 3-input, drain-parallelized readout amplifier circuit 1500 is shown in FIG. 15. As discussed above, the input stages are parallelized while output stage is shared. This gives an area save approaching 33% for large systems (assuming 3 input stages), and the area save is even greater with a larger number of input stages.

Referring now to FIGS. 16-18, shown are circuit diagrams of a non-parallelized readout amplifier. Starting with FIG. 16, shown is the entire set of non-parallelized input stages 1600, in accordance with embodiments of the present disclosure. In particular, FIG. 16 shows a circuit diagram for a 3-input readout amplifier. However, it is to be understood that the number of input stages can be freely scaled based on the needs of the quantum computer. Accordingly, embodiments of the present disclosure may have fewer (e.g., 2) or more (e.g., 10) input stages. Unlike the parallelized designs discussed above, the stage outputs of all of the input stages do not merge together. Instead, each input stage connects to its own output stage circuitry (shown in FIG. 17).

Referring now to FIG. 17, shown is a circuit diagram of a common, or shared, output stage 1700 of the gate-parallelized readout amplifier. As shown, the output stage 1700 includes an input line for each input stage. Accordingly, the output stage 1700 shown in FIG. 17 includes three separate input lines. The output stage 1400 further includes a transistor, such as an HEMT, for each input stage, as well as a single LNA output line (labeled Out). The LNA output line connects the LNA to external circuitry, such as the room temperature electronics.

While the non-parallelized design does not have common output circuitry, the final outputs are merged before leaving the readout amplifier. As such, only a single cable is needed to connect the three LNAs to the room temperature electronics. Additionally, because two of the input stages will be turned off at any given time, the output signal will be the same as one of the stage output signals. For example, if the first input stage is selected, the output signal will be the same as the stage output for the first stage.

A complete 3-input, non-parallelized readout amplifier circuit 1800 is shown in FIG. 18.

Figure 19:
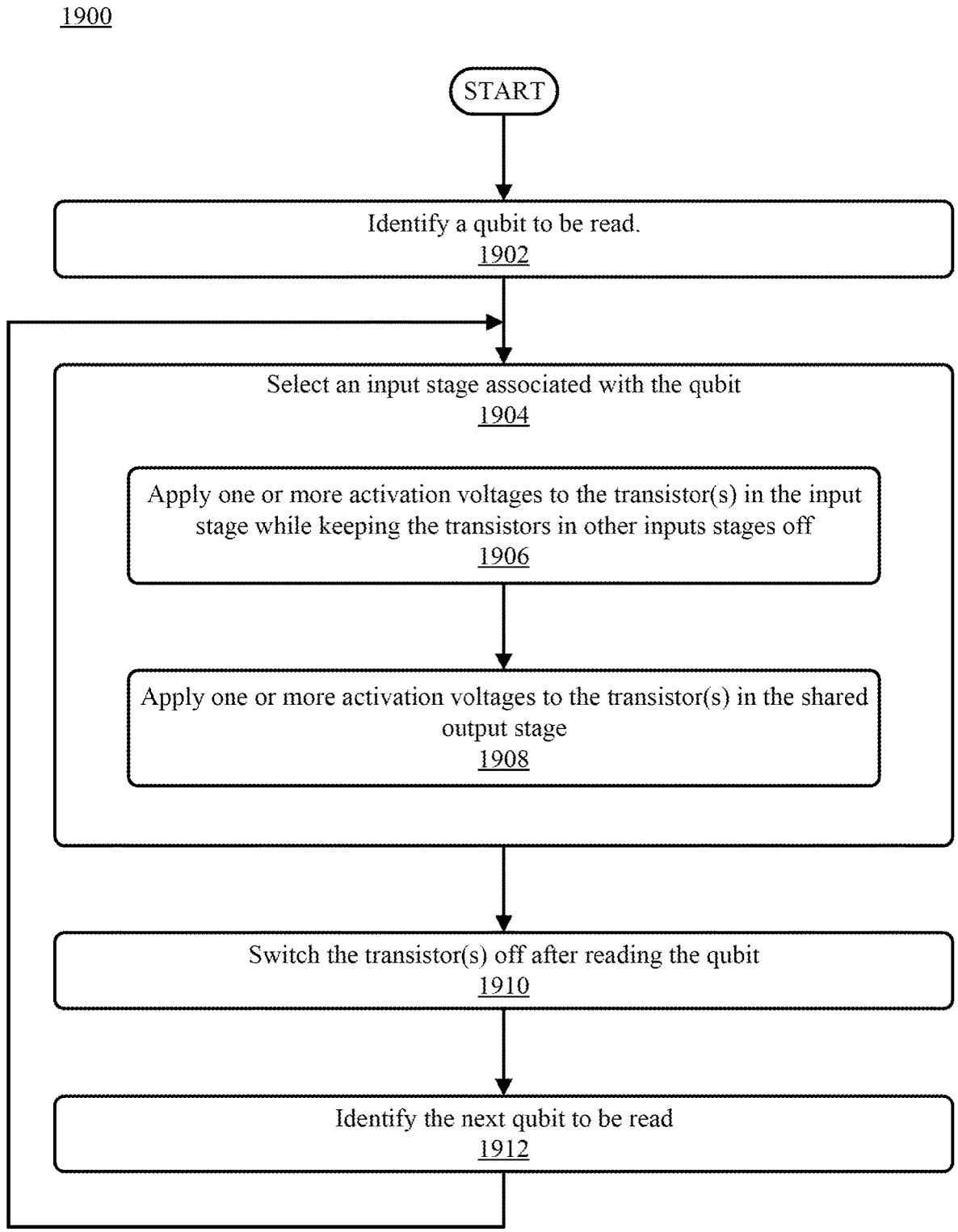
FIG. 19 illustrates a flowchart of an example method for detecting and verifying changes to data referenced by external links, in accordance with embodiments of the present disclosure.

Referring now to FIG. 19, illustrated is a flowchart of an example method 1900 for reading qubits, in accordance with embodiments of the present disclosure. The method 1900 may be performed by hardware, firmware, software executing on a processor, or any combination thereof. For example, the method 1900 may be performed by a processor or controller of a quantum computer. The method 1900 may begin at operation 1902, where a controller identifies a qubit to be read. As discussed herein, the qubit to be read may be identified using, for example, a digital in signal received by the controller from, for example, the room temperature electronics and/or another computer.

At operation 1904, the controller selects the input stage associated with the qubit that is being read. The input stage may correspond to just the qubit or to a set of qubit, depending on whether the quantum computer supports frequency multiplexing. As discussed herein, selecting the input stage associated with the qubit may comprise applying one or more activation voltages to the transistor in the input stage associated with the qubit (operation 1906) and applying one or more activation voltages to the transistor(s) in the shared output stage (operation 1908). All other input stages (i.e., those not associated with the qubit being read) are left inactive. In some embodiments, the output stage is always in a powered-on state. Accordingly, in these embodiments, operation 1908 is not performed.

At operation 1910, the controller may switch off the transistors to the input stage and/or to the output stage after reading the qubit. At operation 1912, the next qubit to be read may be identified, and the method 1900 may return to operation 1904. In this way, the controller may rapidly switch on and off the input stages, thereby acting as an artificial Mux through the rapid switching of LNAs.

Figure 20:
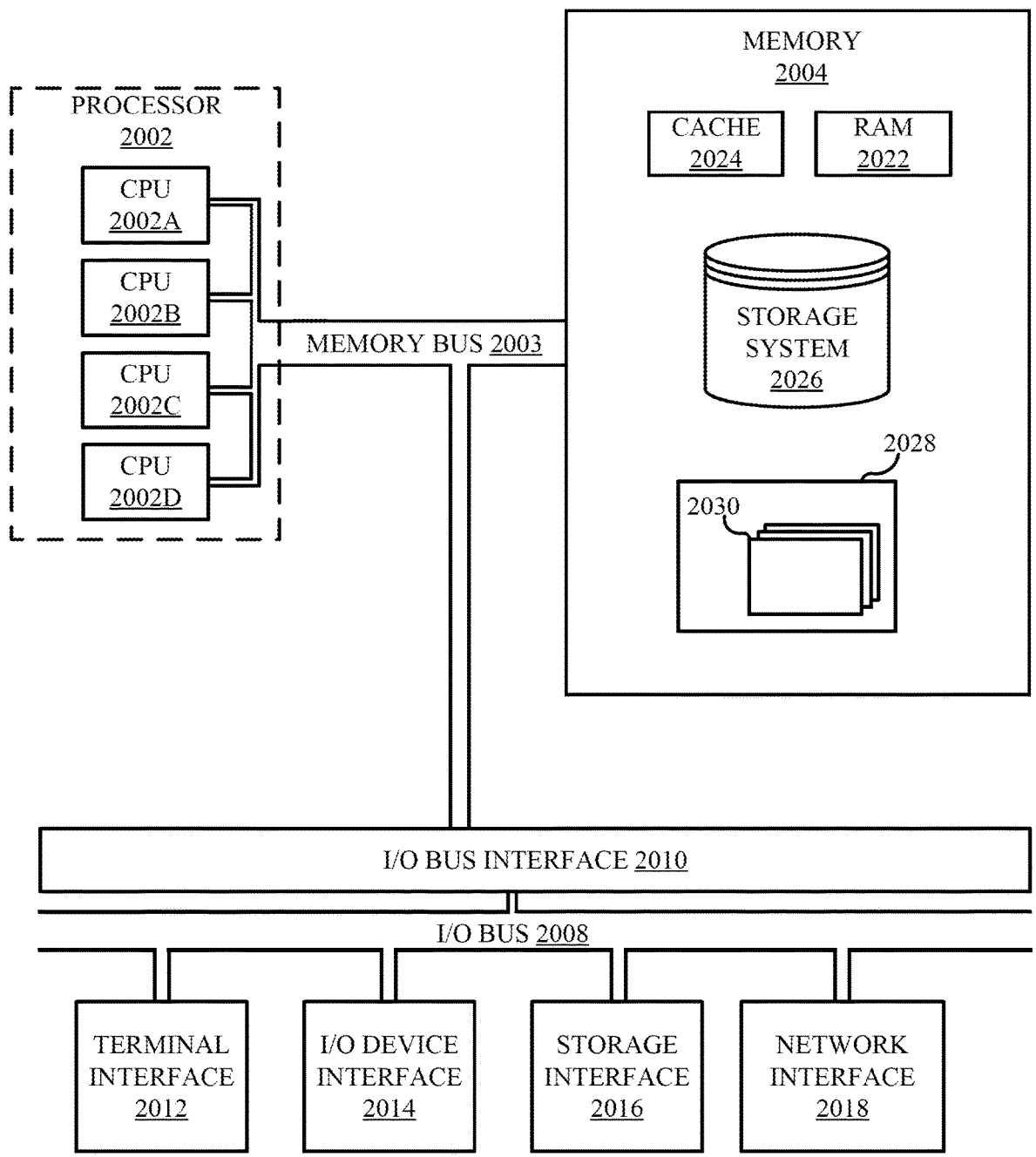
FIG. 20 illustrates a high-level block diagram of an example computer system that may be used in implementing one or more of the methods, tools, and modules, and any related functions, described herein, in accordance with embodiments of the present disclosure.

Referring now to FIG. 20, shown is a high-level block diagram of an example computer system 2001 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 2001 may comprise one or more CPUs 2002, a memory subsystem 2004, a terminal interface 2012, a storage interface 2016, an I/O (Input/Output) device interface 2014, and a network interface 2018, all of which may be communicatively coupled, directly or indirectly, for inter-component communication via a memory bus 2003, an I/O bus 2008, and an I/O bus interface unit 2010.

The computer system 2001 may contain one or more general-purpose programmable central processing units (CPUs) 2002A, 2002B, 2002C, and 2002D, herein generically referred to as the CPU 2002. In some embodiments, the computer system 2001 may contain multiple processors typical of a relatively large system; however, in other embodiments the computer system 2001 may alternatively be a single CPU system. Each CPU 2002 may execute instructions stored in the memory subsystem 2004 and may include one or more levels of on-board cache.

System memory 2004 may include computer system readable media in the form of volatile memory, such as random access memory (RAM) 2022 or cache memory 2024. Computer system 2001 may further include other removable/non-removable, volatile/non-volatile computer system storage media. By way of example only, storage system 2026 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 2004 can include flash memory, e.g., a flash memory stick drive or a flash drive. Memory devices can be connected to memory bus 2003 by one or more data media interfaces. The memory 2004 may include at least one program product having a set (e.g., at least one) of program modules that are configured to carry out the functions of various embodiments.

One or more programs/utilities 2028, each having at least one set of program modules 2030 may be stored in memory 2004. The programs/utilities 2028 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Program modules 2030 generally perform the functions or methodologies of various embodiments.

Although the memory bus 2003 is shown in FIG. 20 as a single bus structure providing a direct communication path among the CPUs 2002, the memory subsystem 2004, and the I/O bus interface 2010, the memory bus 2003 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 2010 and the I/O bus 2008 are shown as single respective units, the computer system 2001 may, in some embodiments, contain multiple I/O bus interface units 2010, multiple I/O buses 2008, or both. Further, while multiple I/O interface units are shown, which separate the I/O bus 2008 from various communications paths running to the various I/O devices, in other embodiments some or all of the I/O devices may be connected directly to one or more system I/O buses.

In some embodiments, the computer system 2001 may be a multi-user mainframe computer system, a single-user system, or a server computer or similar device that has little or no direct user interface, but receives requests from other computer systems (clients). Further, in some embodiments, the computer system 2001 may be implemented as a desktop computer, portable computer, laptop or notebook computer, tablet computer, pocket computer, telephone, smart phone, network switches or routers, or any other appropriate type of electronic device.

It is noted that FIG. 20 is intended to depict the representative major components of an exemplary computer system 2001. In some embodiments, however, individual components may have greater or lesser complexity than as represented in FIG. 20, components other than or in addition to those shown in FIG. 20 may be present, and the number, type, and configuration of such components may vary. Furthermore, the modules are listed and described illustratively according to an embodiment and are not meant to indicate necessity of a particular module or exclusivity of other potential modules (or functions/purposes as applied to a specific module).

Figure 21:
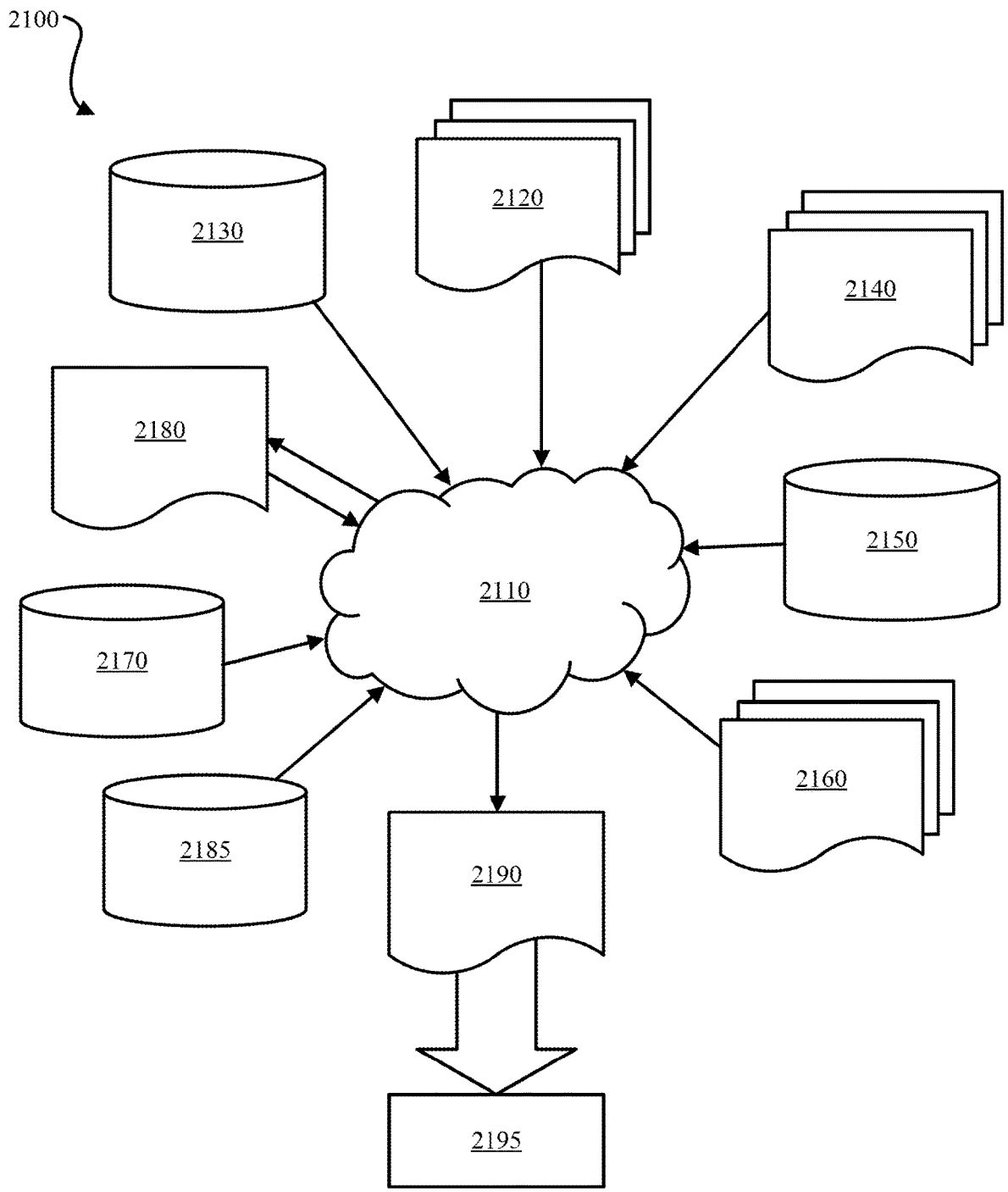
FIG. 21 illustrates a flow diagram of a design process used in semiconductor design, manufacture, and/or test, in accordance with embodiments of the present disclosure.

FIG. 21 shows a block diagram of an exemplary design flow 2100 used for example, in semiconductor IC logic design, simulation, test, layout, and manufacture. Design flow 2100 includes processes, machines, and/or mechanisms for processing design structures or devices to generate logically or otherwise functionally equivalent representations of the design structures and/or devices described above and shown in FIGS. 9-18. The design structures processed and/or generated by design flow 2100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 2100 may vary depending on the type of representation being designed. For example, a design flow 2100 for building an application specific IC (ASIC) may differ from a design flow 2100 for designing a standard component or from a design flow 2100 for instantiating the design into a programmable array, for example a programmable gate array (PGA) or a field programmable gate array (FPGA) offered by Altera® Inc. or Xilinx® Inc.

FIG. 21 illustrates multiple such design structures including an input design structure 2120 that is preferably processed by a design process 2110. Design structure 2120 may be a logical simulation design structure generated and processed by design process 2110 to produce a logically equivalent functional representation of a hardware device. Design structure 2120 may also or alternatively comprise data and/or program instructions that when processed by design process 2110, generate a functional representation of the physical structure of a hardware device. Whether representing functional and/or structural design features, design structure 2120 may be generated using electronic computer-aided design (ECAD) such as implemented by a core developer/designer. When encoded on a machine-readable data transmission, gate array, or storage medium, design structure 2120 may be accessed and processed by one or more hardware and/or software modules within design process 2110 to simulate or otherwise functionally represent an electronic component, circuit, electronic or logic module, apparatus, device, or system such as those shown in FIGS. 9-18. As such, design structure 2120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 2110 preferably employs and incorporates hardware and/or software modules for synthesizing, translating, or otherwise processing a design/simulation functional equivalent of the components, circuits, devices, or logic structures shown in FIGS. 9-18 to generate a Netlist 2180 which may contain design structures such as design structure 2120. Netlist 2180 may comprise, for example, compiled or otherwise processed data structures representing a list of wires, discrete components, logic gates, control circuits, I/O devices, models, etc. that describes the connections to other elements and circuits in an integrated circuit design. Netlist 2180 may be synthesized using an iterative process in which netlist 2180 is resynthesized one or more times depending on design specifications and parameters for the device. As with other design structure types described herein, netlist 2180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 2110 may include hardware and software modules for processing a variety of input data structure types including Netlist 2180. Such data structure types may reside, for example, within library elements 2130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 2140, characterization data 2150, verification data 2160, design rules 2170, and test data files 2185 which may include input test patterns, output test results, and other testing information. Design process 2110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 2110 without deviating from the scope and spirit of the invention. Design process 2110 may also include modules for performing standard circuit design processes such as timing analysis, verification, design rule checking, place and route operations, etc.

Design process 2110 employs and incorporates logic and physical design tools such as HDL compilers and simulation model build tools to process design structure 2120 together with some or all of the depicted supporting data structures along with any additional mechanical design or data (if applicable), to generate a second design structure 2190. Design structure 2190 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 2120, design structure 2190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 9-18. In one embodiment, design structure 2190 may comprise a compiled, executable HDL simulation model that functionally simulates the devices shown in FIGS. 9-18.

Design structure 2190 may also employ a data format used for the exchange of layout data of integrated circuits and/or symbolic data format (e.g. information stored in a GDSII (GDS2), GL1, OASIS, map files, or any other suitable format for storing such design data structures). Design structure 2190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 9-18. Design structure 2190 may then proceed to a stage 2195 where, for example, design structure 2190: proceeds to tape-out, is released to manufacturing, is released to a mask house, is sent to another design house, is sent back to the customer, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications, alterations, and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s). Additionally, it is intended that the following claim(s) be interpreted as covering all such alterations and modifications as fall within the true spirit and scope of the invention.

Example Embodiments

A non-limiting list of examples are provided hereinafter to demonstrate some aspects of the present disclosure. Example Embodiment 1 is a low noise amplifier circuit. The low noise amplifier circuit includes a plurality of input stages, each input stage being coupled to one or more qubits. The low noise amplifier circuit further includes a shared output stage coupled to the plurality of input stages. The low noise amplifier circuit further includes a voltage controller coupled to the plurality of input stages and the shared output stage. The voltage controller is configured to selectively activate an input stage of the plurality of input stages in order to read a qubit coupled to the input stage.

Example Embodiment 2 includes the low noise amplifier circuit of Example Embodiment 1, including or excluding optional features. In this example, the plurality of input stages and the shared output stage are integrated into a single low noise amplifier array chip.

Example Embodiment 3 includes the low noise amplifier circuit of any one of Example Embodiments 1 to 2, including or excluding optional features. In this example, each input stage comprises one or more input matching networks and a transistor. Optionally, each input matching network comprises a plurality of passive components. The plurality of passive components include one or more passive components selected from the group consisting of: one or more resistors; one or more inductors; and one or more capacitors. Optionally, selectively activating the input stage of the plurality input stages comprises supplying, by the voltage controller, a voltage to the transistor for the input stage, wherein the voltage is greater than a threshold voltage of the transistor. Optionally, selectively activating the input stage of the plurality input stages further comprises supplying, by the voltage controller, a second voltage to the transistor for the input stage. Optionally, the voltage is supplied to a gate of the transistor and the second voltage is supplied to a drain of the transistor.

Example Embodiment 4 includes the low noise amplifier circuit of any one of Example Embodiments 1 to 2, including or excluding optional features. In this example, each input stage comprises a first input matching network, a second input matching network, and a transistor. The first input matching network is coupled to a gate of the transistor and the second input matching network is coupled to a drain of the transistor. Optionally, selectively activating the input stage of the plurality input stages comprises supplying, by the voltage controller, a voltage to the transistor for the input stage, wherein the voltage is greater than a threshold voltage of the transistor. Optionally, selectively activating the input stage of the plurality input stages further comprises supplying, by the voltage controller, a second voltage to the transistor for the input stage. Optionally, the voltage is supplied to a gate of the transistor and the second voltage is supplied to a drain of the transistor.

Example Embodiment 5 includes the low noise amplifier circuit of any one of Example Embodiments 1 to 4, including or excluding optional features. In this example, the output stage comprises one or more output matching networks and a transistor. Optionally, the output matching network comprises a plurality of passive components. The plurality of passive components include one or more passive components selected from the group consisting of: one or more resistors; one or more inductors; and one or more capacitors.

Example Embodiment 6 includes the low noise amplifier circuit of any one of Example Embodiments 1 to 5, including or excluding optional features. In this example, the output stage is kept active during operation by the voltage controller. Additionally, input stages that are not being read from are not powered by the voltage controller.

Example Embodiment 7 includes the low noise amplifier circuit of any one of Example Embodiments 1 to 6, including or excluding optional features. In this example, each input stage is connected to a plurality of qubits using frequency multiplexing.

Example Embodiment 8 includes the low noise amplifier circuit of any one of Example Embodiments 1 to 7, including or excluding optional features. In this example, the plurality of input stages and the output stage are in a cryostat of a quantum computer. Optionally, the voltage controller is in the cryostat of the quantum computer.

Example Embodiment 9 is an amplifier array for a quantum computer, the amplifier array. The amplifier array for a includes a plurality of input stage circuits. Each input stage circuit corresponds to one or more qubit. The amplifier array further includes a shared output circuit coupled to the plurality of input stage circuits.

Example Embodiment 10 includes the amplifier array of example 9, including or excluding optional features. In this example, the plurality of input stage circuits and the shared output circuit are integrated into a single low noise amplifier array chip.

Example Embodiment 11 includes the amplifier array of any one of Example Embodiments 9 to 10, including or excluding optional features. In this example, each input stage comprises one or more input matching networks. Each input matching network comprises a plurality of passive components. The plurality of passive components include one or more passive components selected from the group consisting of one or more resistors, one or more capacitors, and one or more inductors. Each input stage further includes a transistor.

Example Embodiment 12 is a method for reading a qubit. The method includes identifying a qubit to be read and selecting, from an amplifier array, a first input stage that is connected to the qubit without powering other inputs stages of the amplifier array. The amplifier array comprises a plurality of input stages, each input stage corresponding to one or more qubits, and a shared output stage coupled to the plurality of input stages.

Example Embodiment 13 includes the method of Example Embodiment 12, including or excluding optional features. In this example, each input stage further comprises one or more input matching networks and a transistor. In this example, selecting the input stage that is connected to the qubit comprises supplying an activating voltage to the transistor of the first input stage.

Example Embodiment 14 is a quantum computer. The quantum computer includes a cryostat having a low noise amplifier and a voltage controller coupled to the low noise amplifier. The low noise amplifier comprises a plurality of input stages, each input stage being coupled to one or more qubits, and a shared output stage coupled to the plurality of input stages. The voltage controller is configured to selectively activate a first input stage of the plurality of input stages in order to read a qubit coupled to the first input stage without activating the other input stages.

Example Embodiment 15 includes the quantum computer of Example Embodiment 14, including or excluding optional features. In this example, each input stage comprises a first input matching network, a second input matching network, and a transistor. The first input matching network is coupled to a gate of the transistor, and the second input matching network is coupled to a drain of the transistor.

Example Embodiment 16 is a computer program product comprising a computer readable storage medium having program instructions embodied therewith. The computer-readable medium includes instructions that direct the controller to perform a method comprising identifying a qubit to be read and selecting, from an amplifier array, a first input stage that is connected to the qubit. The amplifier array comprises: a plurality of input stages, each input stage corresponding to one or more qubits, and a shared output stage coupled to the plurality of input stages.

What is claimed is:

1. A low noise amplifier circuit comprising:
   a plurality of input stages, each input stage being coupled to one or more qubits, wherein the plurality of input stages comprises one or more input matching networks, and a transistor, wherein each input matching network comprises a plurality of passive components, the plurality of passive components including one or more passive components selected from the group consisting of: one or more resistors, one or more inductors, and one or more capacitors;
   a shared output stage coupled to the plurality of input stages; and
   a voltage controller coupled to the plurality of input stages and the shared output stage, wherein the voltage controller is configured to selectively activate an input stage of the plurality of input stages in order to read a qubit coupled to the input stage.

2. The low noise amplifier circuit of claim 1, wherein the plurality of input stages and the shared output stage are integrated into a single low noise amplifier array chip.

3. The low noise amplifier circuit of claim 1, wherein selectively activating the input stage of the plurality input stages comprises supplying, by the voltage controller, a voltage to the transistor for the input stage, wherein the voltage is greater than a threshold voltage of the transistor.

4. The low noise amplifier circuit of claim 3, wherein selectively activating the input stage of the plurality input stages further comprises supplying, by the voltage controller, a second voltage to the transistor for the input stage.

5. The low noise amplifier circuit of claim 4, wherein the voltage is supplied to a gate of the transistor and the second voltage is supplied to a drain of the transistor.

6. The low noise amplifier circuit of claim 1, wherein each input stage comprises:
   a first input matching network;
   a first output matching network; and
   a transistor, wherein the first input matching network is coupled to a gate of the transistor and the first output matching network is coupled to a drain of the transistor.

7. The low noise amplifier circuit of claim 6, wherein selectively activating the input stage of the plurality input stages comprises supplying, by the voltage controller, a voltage to the transistor for the input stage, wherein the voltage is greater than a threshold voltage of the transistor.

8. The low noise amplifier circuit of claim 7, wherein selectively activating the input stage of the plurality input stages further comprises supplying, by the voltage controller, a second voltage to the transistor for the input stage.

9. The low noise amplifier circuit of claim 8, wherein the voltage is supplied to a gate of the transistor and the second voltage is supplied to a drain of the transistor.

10. The low noise amplifier circuit of claim 1, wherein the output stage comprises:
    one or more output matching networks; and
    a transistor.

11. The low noise amplifier circuit of claim 10, wherein the output matching network comprises a plurality of passive components, the plurality of passive components including one or more passive components selected from the group consisting of:
    one or more resistors;
    one or more inductors; and
    one or more capacitors.

12. The low noise amplifier circuit of claim 1, wherein the output stage is kept active during operation by the voltage controller, and wherein input stages that are not being read from are not powered by the voltage controller.

13. The low noise amplifier circuit of claim 1, wherein each input stage is connected to a plurality of qubits using frequency multiplexing.

14. The low noise amplifier circuit of claim 1, wherein the plurality of input stages and the output stage are in a cryostat of a quantum computer.

15. The low noise amplifier circuit of claim 14, wherein the voltage controller is in the cryostat of the quantum computer.

16. An amplifier array for a quantum computer, the amplifier array comprising:
    a plurality of input stage circuits, each input stage circuit corresponding to one or more qubits;
    a shared output circuit coupled to the plurality of input stage circuits; and
    wherein each input stage comprises one or more input matching networks, each input matching network comprising a plurality of passive components, the plurality of passive components including one or more passive components selected from the group consisting of one or more resistors, one or more capacitors, and one or more inductors, and a transistor.

17. The amplifier array of claim 16, wherein the plurality of input stage circuits and the shared output circuit are integrated into a single low noise amplifier array chip.

18. A method for reading a qubit, the method comprising:
    identifying a qubit to be read; and
    selecting, from an amplifier array, a first input stage that is connected to the qubit without powering other inputs stages of the amplifier array, wherein the amplifier array comprises:
    a plurality of input stages, each input stage corresponding to one or more qubits, wherein the plurality of input stages comprises one or more input matching networks, and a transistor, wherein each input matching network comprises a plurality of passive components, the plurality of passive components including one or more passive components selected from the group consisting of: one or more resistors, one or more inductors, and one or more capacitors;

a shared output stage coupled to the plurality of input stages.

19. The method of claim 18, wherein each input stage comprises one or more input matching networks and a transistor, and wherein selecting the input stage that is connected to the qubit comprises:

supplying an activating voltage to the transistor of the first input stage.

20. A quantum computer comprising:

a cryostat having a low noise amplifier, the low noise amplifier comprising:

a plurality of input stages, each input stage being coupled to one or more qubits, wherein each input stage comprises a first input matching network, a first output matching network; and a transistor, wherein the first input matching network is coupled to a gate of the transistor and the first output matching network is coupled to a drain of the transistor; and a shared output stage coupled to the plurality of input stages; and a voltage controller coupled to the low noise amplifier, wherein the voltage controller is configured to selectively activate a first input stage of the plurality of input stages in order to read a qubit coupled to the first input stage without activating the other input stages.

21. A computer program product comprising a computer readable storage medium having program instructions embodied therewith, the program instructions executable by a controller to cause the controller to perform a method comprising:

identifying a qubit to be read; and selecting, from an amplifier array, a first input stage that is connected to the qubit, wherein the amplifier array comprises:

a plurality of input stages, each input stage corresponding to one or more qubits, wherein the plurality of input stages comprises one or more input matching networks, and a transistor, wherein each input matching network comprises a plurality of passive components, the plurality of passive components including one or more passive components selected from the group consisting of: one or more resistors, one or more inductors, and one or more capacitors;

a shared output stage coupled to the plurality of input stages.

* * * * *